(12) United States Patent
Yasamura et al.

(10) Patent No.: US 8,047,855 B2
(45) Date of Patent: Nov. 1, 2011

(54) HIGH SPEED, DIRECT PATH, STAIR-STEP, ELECTRONIC CONNECTORS WITH IMPROVED SIGNAL INTEGRITY CHARACTERISTICS AND METHODS FOR THEIR MANUFACTURE

(75) Inventors: Gary Yasamura, Santa Clara, CA (US); Joseph C. Fjelstad, Maple Valley, WA (US); William F. Wiedemann, Campbell, CA (US); Para K. Segaram, Brookfield (AU); Kevin P. Grundy, Fremont, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/693,097

(22) Filed: Jan. 25, 2010

(65) Prior Publication Data
US 2010/0151704 A1   Jun. 17, 2010

Related U.S. Application Data

(62) Division of application No. 11/868,947, filed on Oct. 8, 2007, now Pat. No. 7,651,336, which is a division of application No. 11/055,579, filed on Feb. 9, 2005, now Pat. No. 7,278,855.

(60) Provisional application No. 60/543,141, filed on Feb. 9, 2004.

(51) Int. Cl.
H01R 12/00   (2006.01)
H05K 1/00   (2006.01)
(52) U.S. Cl. .......................................... 439/65; 439/862
(58) Field of Classification Search ................... 439/65, 439/66, 74, 862
See application file for complete search history.

(56) References Cited

U.S. PATENT DOCUMENTS

| | | | |
|---|---|---|---|
| 3,007,131 A * | 10/1961 | Dahlgren et al. | 439/492 |
| 4,116,516 A * | 9/1978 | Griffin | 439/67 |
| 4,201,432 A * | 5/1980 | Chalmers | 439/82 |
| 4,390,224 A * | 6/1983 | Showman et al. | 439/264 |
| 5,373,109 A * | 12/1994 | Argyrakis et al. | 174/117 FF |
| 5,667,401 A * | 9/1997 | Kuwabara et al. | 439/405 |
| 6,179,629 B1 * | 1/2001 | Lai et al. | 439/79 |
| 6,322,372 B1 * | 11/2001 | Sato | 439/65 |
| 7,172,465 B2 * | 2/2007 | Kinsley | 439/637 |
| 7,278,855 B2 | 10/2007 | Yasumura et al. | |
| 7,651,336 B2 | 1/2010 | Yasumura et al. | |

* cited by examiner

*Primary Examiner* — Hae Moon Hyeon
(74) *Attorney, Agent, or Firm* — Myers Bigel Sibley & Sajovec, P.A.

(57) ABSTRACT

An electrical connector comprised of a plurality of electrical contacts arranged in a stair-step configuration designed to mate with electrical components having electrical contacts arranged in a stair-step configuration. A direct connect signaling system comprised of stair-step electrical connectors mated to stair-step printed circuit boards, other stair-step electrical components, or combinations thereof.

18 Claims, 21 Drawing Sheets

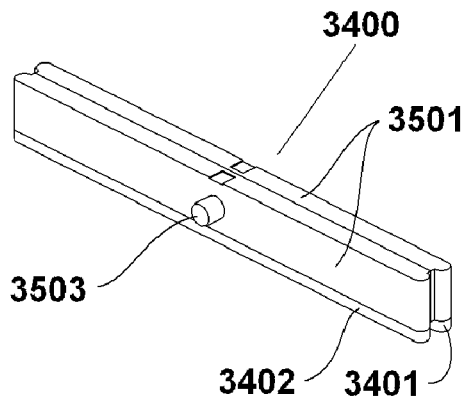
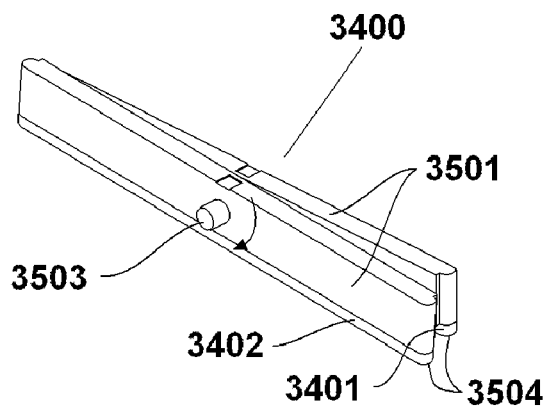
FIGURE 35A  FIGURE 35B
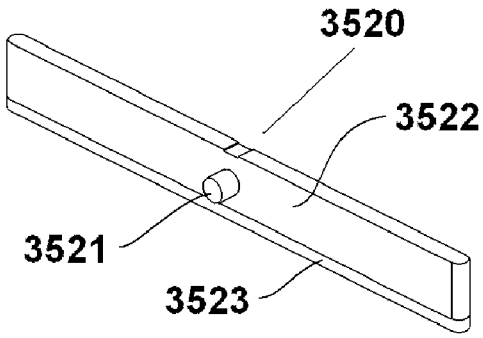
FIGURE 35C
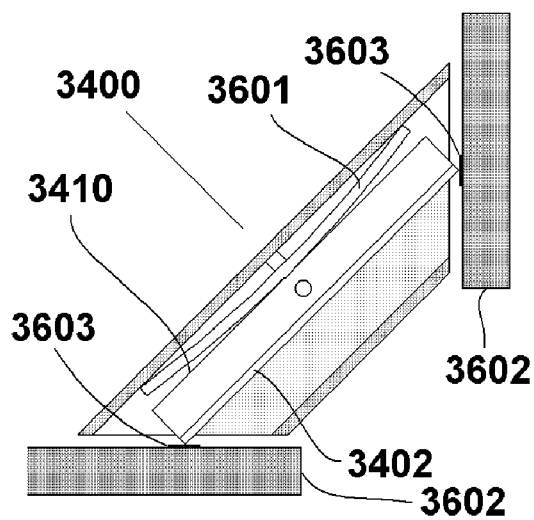
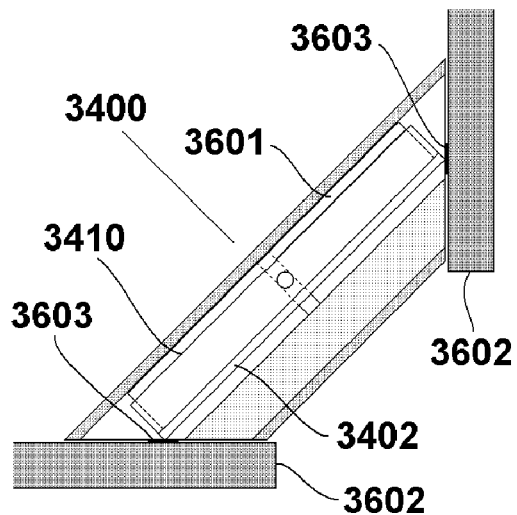
FIGURE 36A  FIGURE 36B

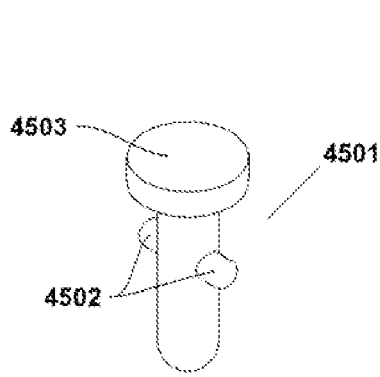
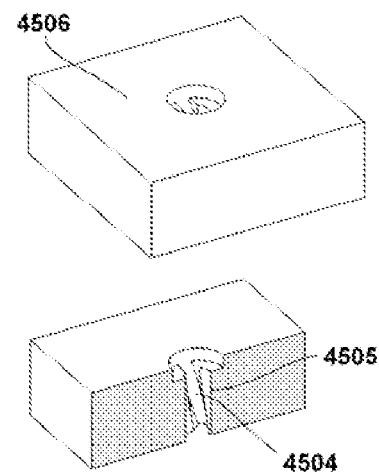
FIGURE 45A FIGURE 45B
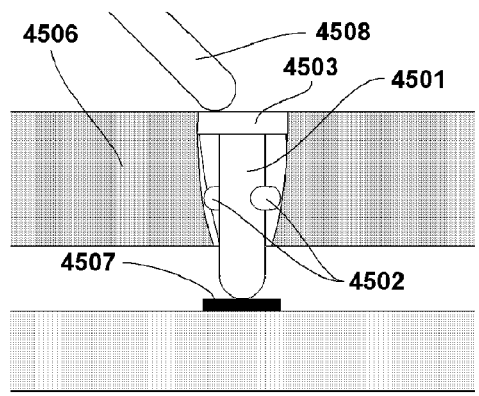
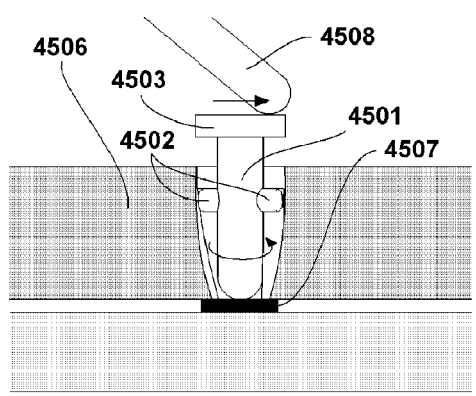
FIGURE 45C FIGURE 45D
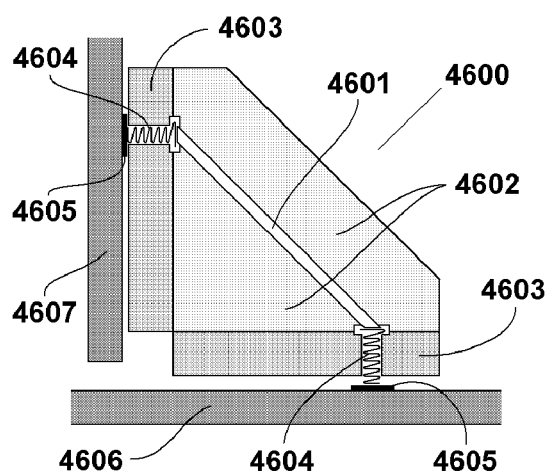
FIGURE 46

HIGH SPEED, DIRECT PATH, STAIR-STEP, ELECTRONIC CONNECTORS WITH IMPROVED SIGNAL INTEGRITY CHARACTERISTICS AND METHODS FOR THEIR MANUFACTURE

CROSS-REFERENCE TO RELATED APPLICATIONS

This application is a divisional of, and hereby incorporates by reference in its entirety and for all purposes, U.S. patent application Ser. No. 11/868,947, filed Oct. 8, 2007 and issuing on Jan. 26, 2010 as U.S. Pat. No. 7,651,336. U.S. Pat. No. 7,651,336 is a divisional of, and incorporates by reference in its entirety, U.S. patent application Ser. No. 11/055,579, filed Feb. 9, 2005. U.S. patent application Ser. No. 11/055,579 claims the benefit of and incorporates by reference U.S. Provisional Application No. 60/543,141, filed Feb. 9, 2004.

TECHNICAL FIELD

The disclosed embodiments relate generally to the field of electrical connectors. More particularly, the disclosed embodiments relate to connectors with stair-step structures that interface with stair-step structures on printed circuit boards or other electrical components.

BACKGROUND

Electronic systems that utilize printed circuit boards require some or all of the electrical signals to enter, traverse and exit the printed circuit board. In systems that use high frequency electrical signals, the site of connections between the printed circuit board and electronic components, as well as connections to other printed circuit boards, is often the site of signal attenuation, reflection, interference and skew, all of which contribute to signal degradation that may harm the performance of the system. System architects can maintain signal integrity by designing connectors that lower inductance, reduce parasitic capacitance, minimize signal distortion and reflections, eliminate skew, and match impedance, wherever possible. In addition, system architects can improve signal integrity by designing connectors that optimize electromechanical contact force and contact wipe.

Vias, or plated through holes, in printed circuit boards can cause significant harm to signal integrity, yet vias are commonly used to make electromechanical connections to printed circuit boards. FIG. 1 illustrates a prior-art connector system in which the connector 101 attaches to a printed circuit board 102, where the printed circuit board contains multiple layers 103. A conductive pin 104 is inserted into a plated through hole 105 (which consists of a hole 106, drilled through the printed circuit board, and an annular pad 107—both of which are plated with a conductive material). In this illustration, the plated through holes create anchor points for the connector, and the plated through hole makes an electrical connection between the conductive pin 104 and a trace 108 that may be located one or more layers within the printed circuit board.

Stair-step printed circuit board structures, examples of which appear in FIG. 1A, may limit or eliminate the need to use vias in order to make connections to traces that exist one or more layers below the surface of the printed circuit board 101a. Traces 102a below the surface of the printed circuit board are exposed by the stair-step structure in which layers of the printed circuit board above the trace are removed. In one stair-step implementation, 103a, the traces are exposed at edge of the printed circuit board. In another implementation, 104a, the traces are exposed away from the edge of the printed circuit board. Stair-step printed circuit board structure may require stair-step connectors by which electrical components can be connected to the stair-step printed circuit board.

BRIEF DESCRIPTION OF DRAWINGS

The present invention is illustrated by way of example, not by way of limitation, in the figures of the accompanying drawings and in which like reference numerals refer to similar elements and in which:

FIG. 5A shows the unmated condition and FIG. 5B shows the mated condition as the signal conductors touch down on electrical contact pads on a printed circuit board or electrical component.

FIG. 35A illustrates an embodiment of a rigid conductor assembly whose individual conductor beams are aligned with respect to each other about a rod serving as a pivoting axle.

FIG. 35B illustrates an embodiment of a rigid conductor assembly whose individual conductor beams are rotated with respect to each other about a rod serving as a pivoting axle.

FIG. 35C illustrates an embodiment of a single conductor assembly composed of a pivot rod, insulating beam and conductor beam.

FIG. 36A illustrates an embodiment of an electrical connector cross section of a leaf spring urging the rigid conductor beam into the unmated position.

FIG. 36B illustrates an embodiment of an electrical connector cross section showing how mating forces the leaf spring to straighten out.

FIG. 45A illustrates an embodiment of a push pin with a nail head at its top and projecting tabs on its side.

FIG. 45B illustrates a locating plate in isometric view and a cross section below it showing a cavity that accepts the push pin in FIG. 45A.

FIGS. 45C and 45D illustrate the push pin, the cantilever conductive beam and the locating plate as they would operate during mating and unmating.

FIG. 46 illustrates an embodiment of the invention wherein the angled conductor beams are fixed to the electrical connector body, do not move relative to it and have spring members at either end of the beams.

DETAILED DESCRIPTION

Figure 1:
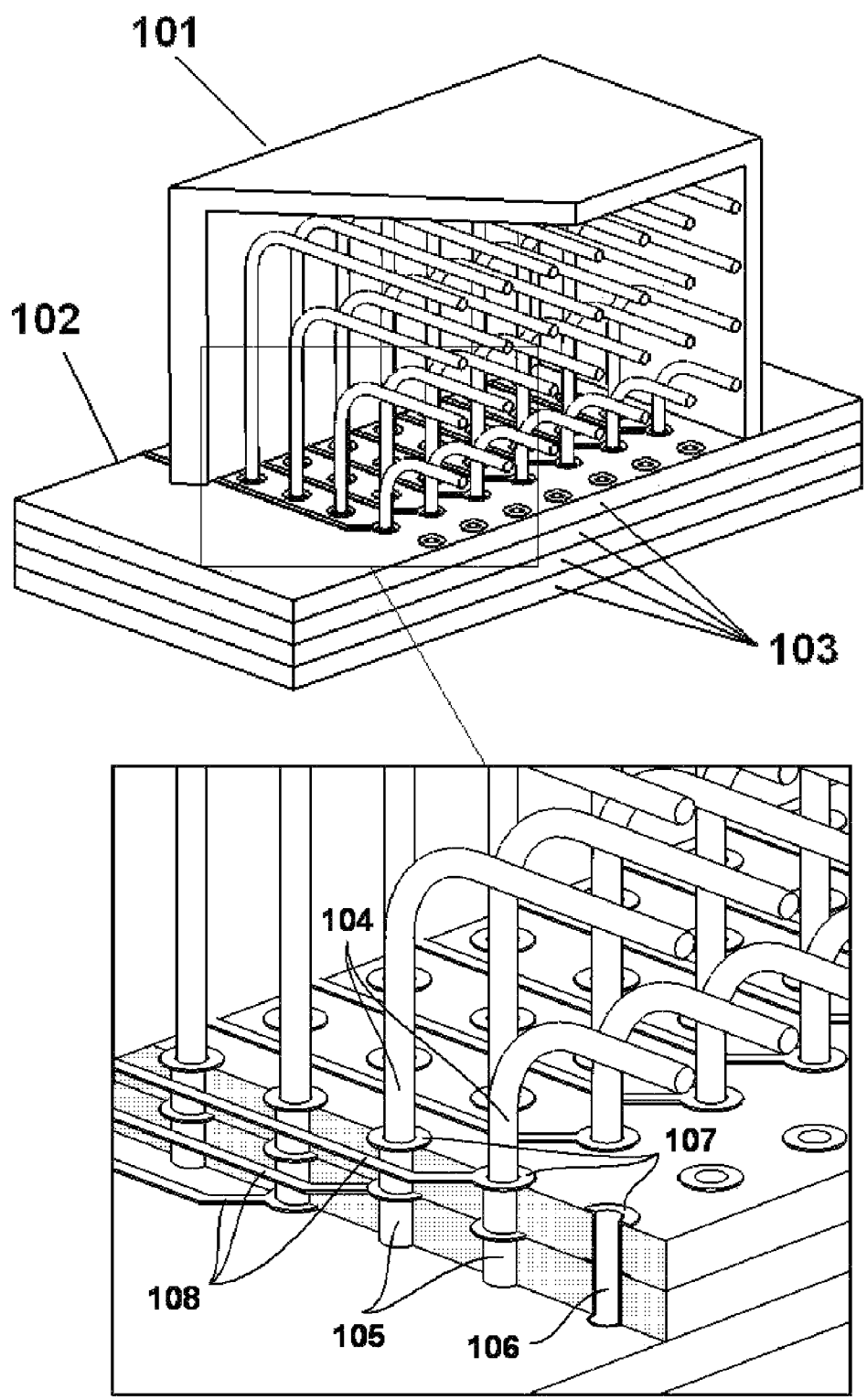
FIG. 1 illustrates fundamental prior art structures for use in constructing electrical connectors with an enlarged view of the connection detail.

In the following description and in the accompanying drawings, specific terminology and drawing symbols are set forth to provide a thorough understanding of the embodiments of the invention. In some instances, the terminology and symbols may imply specific details that are not required to practice the invention. For instance, in embodiments having a printed circuit board, other electronic components or structures, including but not limited to flexible circuits with layers of metal and dielectric, ceramic or silicon substrates, hybrid circuits, integrated circuits, integrated circuit packages, or a combination of them can be substituted for the printed circuit board. Examples of printed circuit boards include, without limitation, line cards, daughter boards, daughter cards, mother boards, backplanes and so forth. Unless specifically stated otherwise, printed circuit boards shown or described at a 90 or 180 degree angle to each other may be at any other angle in alternative embodiments.

Structures and methods for making direct path, three dimensional interconnections between stair-step printed circuit boards are disclosed herein in various embodiments. Stepped printed circuit boards described herein refer to, for example, any of the stair-step printed circuit board structures disclosed in U.S. patent application Ser. No. 10/990,280 ("Stair-step Printed Circuit Board Structures for High Speed Signal Transmissions"), filed Nov. 15, 2004, which is incorporated herein by reference.

Many of the figures show two conductors that comprise a differential signal pair. Such conductors may use any conductive material including but not limited to metal-coated dielectric material, metal, conductive elastomers or conductive plastics. The conductor traces shown may also be single-ended conductors, single conductors in microwave and stripline geometries, and coaxial conductors. In figures showing a cross sectioned view, additional conductors may be present behind and/or in front of the visible conductors. Also, while a conductor may be illustrated as having a specific angle with respect to a printed circuit board's surface, it may be at any angle with respect to a printed circuit board's surface.

In any figure, electrical contacts on a device's stair-step structure represent rows or arrays of electrical contacts on different physical levels or layers of the printed circuit board. In other figures or within any one figure, electrical contacts on a given planar surface of a device may represent rows or arrays of electrical contacts on a plane. In any figure showing a stair-step connector mating to a stair-step component, the stair-step structure on the component may be replaced by a planar connection structure. In any figure, a specific number of layers composed of dielectric sheets, rows of conductors or ground planes may be illustrated, but this does not limit the number of layers that could be present in an embodiment of the invention. In electrical connectors, electrical components, printed circuit boards, hybrid circuits, flexible circuits or the like with multiple layers of conductive and insulating materials, all the conductive layers can be exposed for physical interconnection access by removing successive layers in a stair-step configuration. Essentially, the first conductive layer is exposed and made accessible by removing all the insulating and conductive layers above the first conductive layer. In sequence, the second conductive layer is exposed and made accessible by removing all the insulating and conductive layers above the second conductive layer. The same procedure is followed until all desired conductive layers have been exposed and made accessible. An objective in removing material layers in this stair-step fashion is provide direct electrical interconnection access to electrical contact pads or conductive signal traces that are normally hidden inside the electrical device.

In embodiments of the invention, high-speed, low-complexity structures are disclosed that facilitate fundamentally or substantially direct connection between printed circuit boards, flexible circuits with layers that include but are not limited to metal and dielectric material, ceramic or silicon substrates, hybrid circuits, integrated circuits, integrated circuit packages, electronic components or a combination of them.

FIG. 1 illustrates prior art for comparison purposes.

Figure 1A:
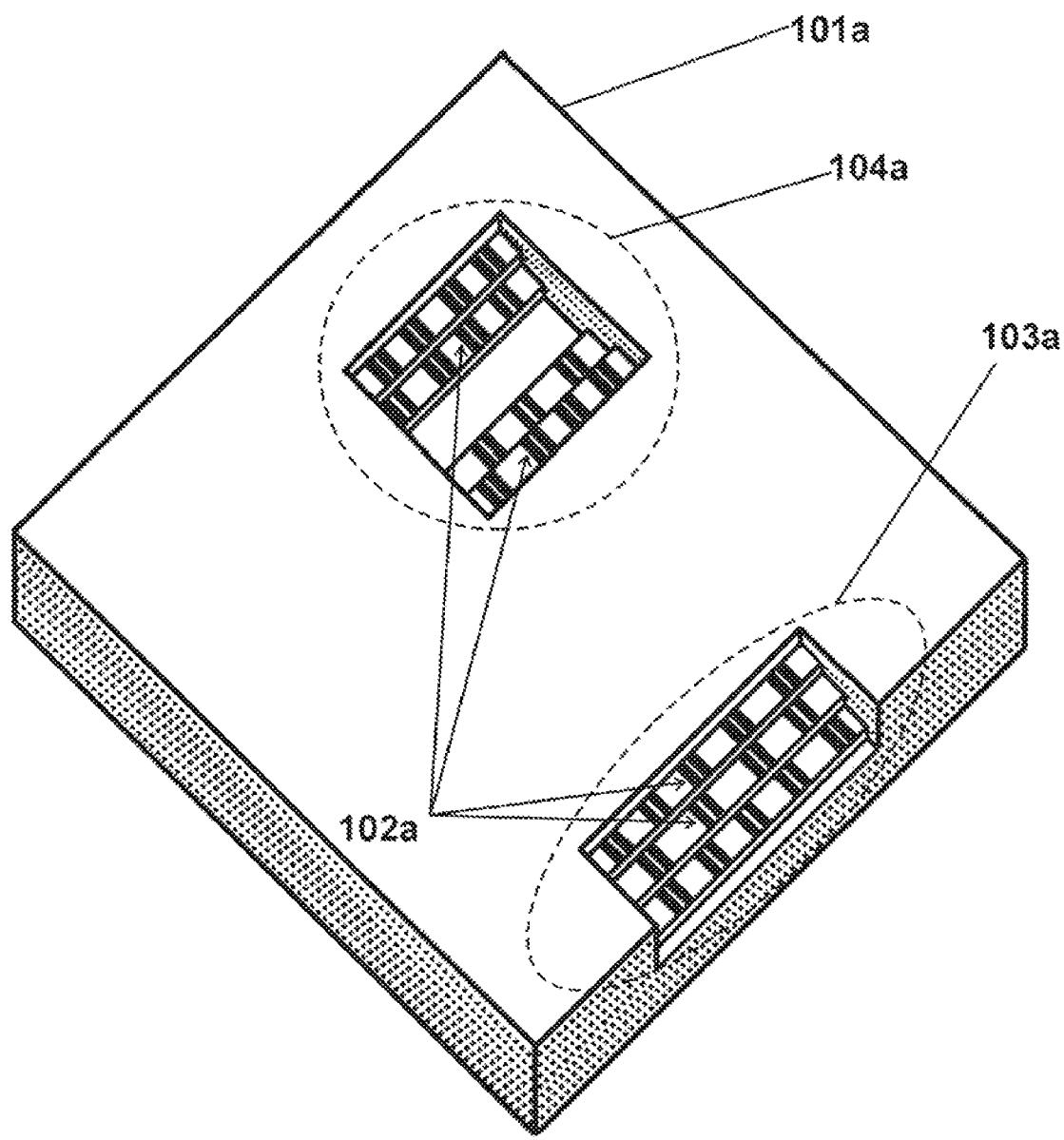
FIG. 1A shows a stair-step printed circuit board illustrating stair-step structures to which some embodiments of the invention can connect.

FIG. 1a illustrates stair-step printed circuit board structures where traces 102a are exposed by the stair-step structure 103a at the edge, or the stair-step structure 104a located away from the of a printed circuit board 101a.

Figure 2:
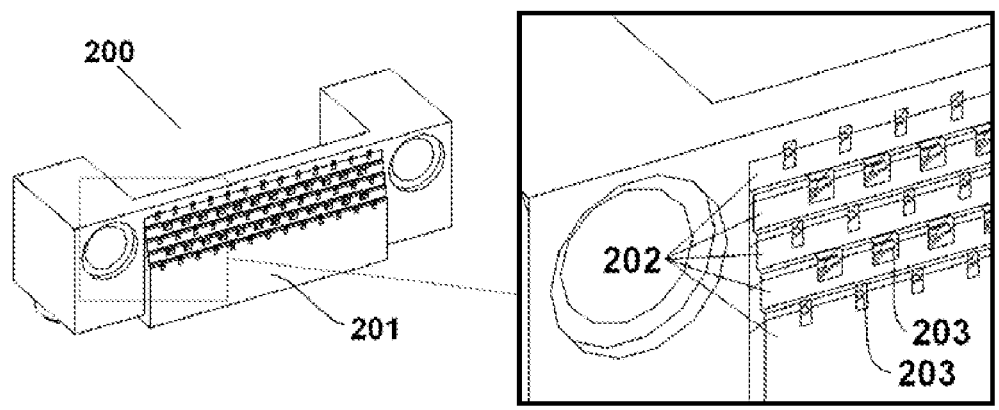
FIG. 2 illustrates an embodiment of the invention wherein a stair-step the electrical contact interface has a stair-step configuration.

FIG. 2 illustrates one embodiment of the invention, which is a high-speed, direct-path, stair-step electrical connector 200. As shown, the connector includes the front contact interface 201. It shows an enlarged view of the stair-step configuration 202 of the rows of electrical contacts 203. In this embodiment of the invention, the rows of contacts 203 shown in FIG. 2 are on different planes creating a stair-step configuration 202. As a result, a stair-step electrical connector 200 can directly contact stair-step signal traces or stair-step electrical contact pads on a target stair-step structure, for instance on a stair-step printed circuit board.

Figure 3:
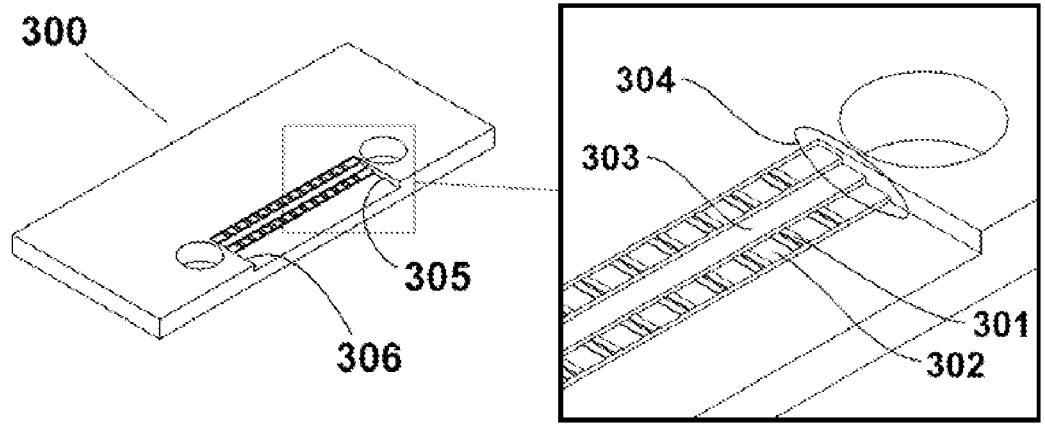
FIG. 3 illustrates an embodiment of a printed circuit board or other electrical component that allows the insulating layers, conductive traces and ground planes on the stair-step connector to contact the insulating layers, conductive traces and ground planes on stair-step printed circuit boards or other electrical components.
Figure 18:
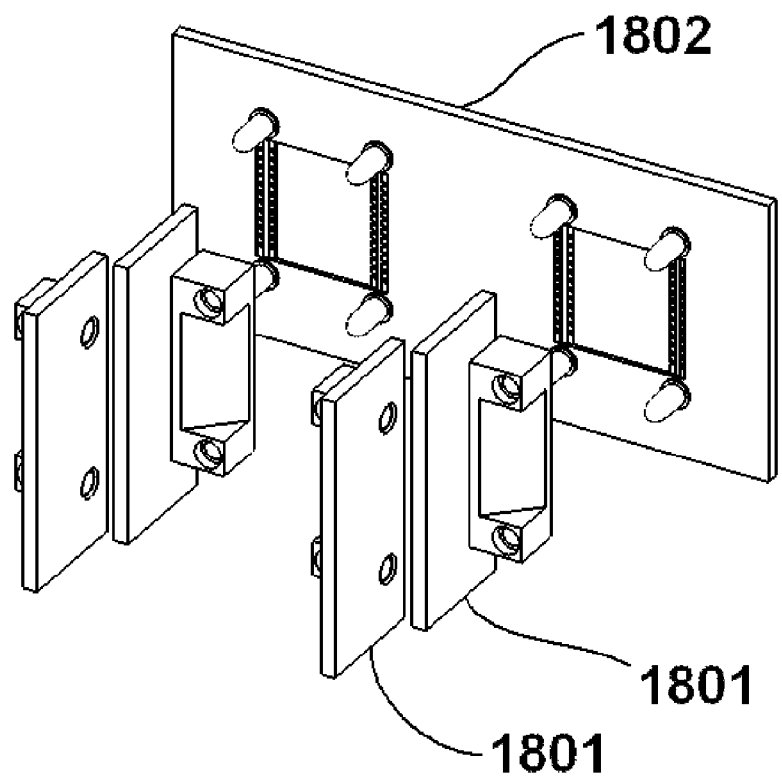
FIG. 18 is an exploded view of an embodiment of the invention in which a stair-step electrical connector mates stair-step line cards with a stair-step printed circuit board.
Figure 20:
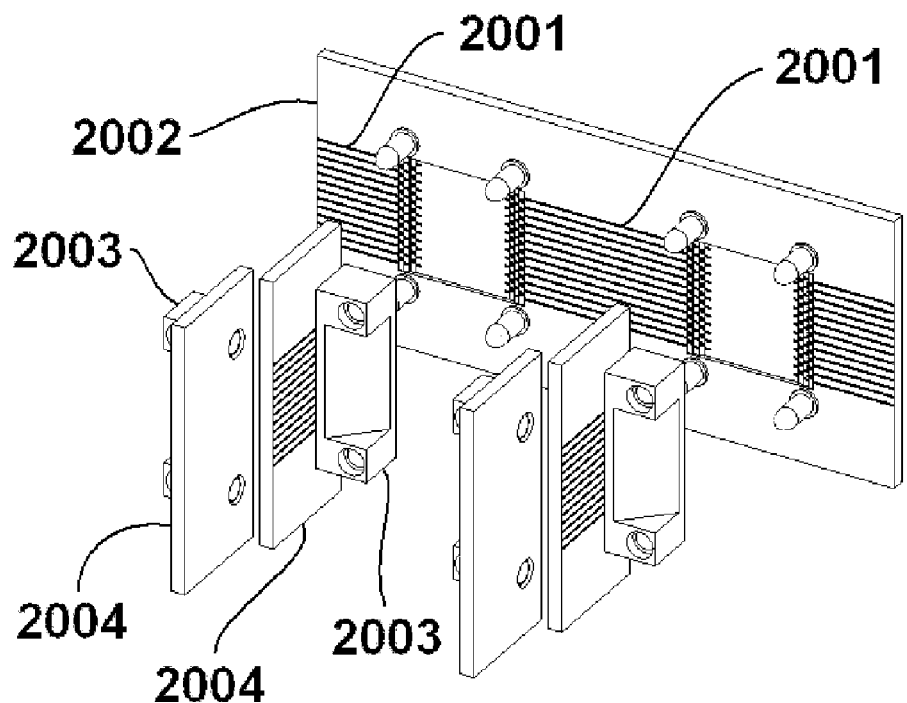
FIG. 20 illustrates FIG. 18 except with signal traces on the printed circuit boards shown.

FIG. 3 illustrates an embodiment of a multi-layer printed circuit board 300, wherein signal traces or electrical contact pads 301 in one layer 302 are exposed by routing or laser cutting the layer 303 above. This produces a stair-step configuration 304 wherein each step has a row of printed circuit board signal traces and/or a continuous conductive ground plane that act as contact pad(s) with which the electrical connector 200 can interface. The stair-step configuration 304 in FIG. 3 includes two bracketing walls 305, 306 that are at right angles to the stair-step surfaces and the exposed signal traces. The walls can form a physical boundary for the printed circuit board's stair-step that can be used to guide, mate with and protect embodiments of the invention, a stair-step electrical connector 200. In another configuration, the stair-step extends to either end of the printed circuit board perimeter so that there are no walls. In another configuration the stair-step structure may be exposed in the center of the printed circuit board, rather than at the edge, as shown in FIGS. 1a, 18 and 20.

Figure 4:
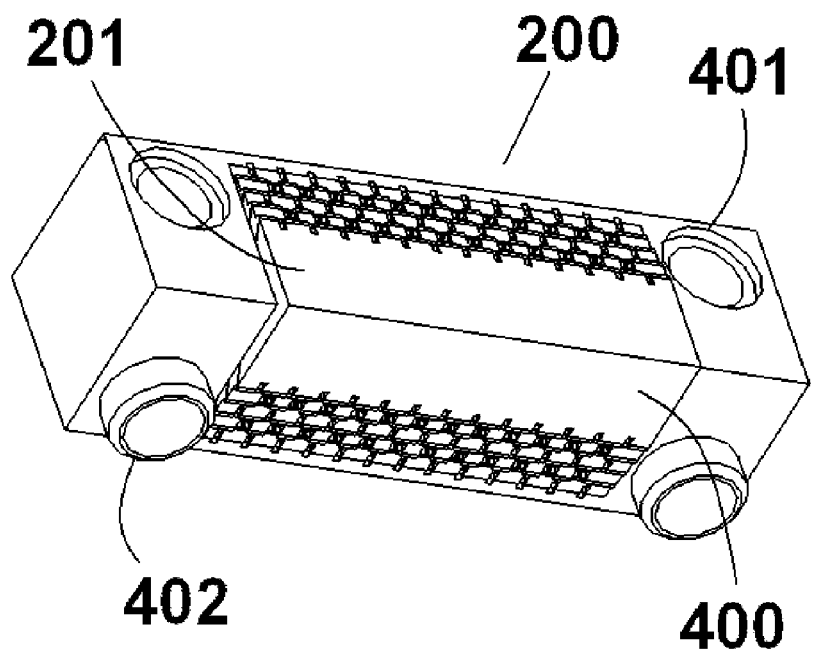
FIG. 4 illustrates another view of the embodiment of the invention from FIG. 2 showing both sides of the electrical contact interfaces. Each interface has a stair-step structure that mates with a stair-step structure on the printed circuit board or other electrical component.

FIG. 4 illustrates the front contact interface 201 and bottom contact interface 400 with their rows of the contacts in electrical connector 200 in an embodiment of the invention that connects two stair-step structures that would be situated perpendicular to each other when connected. Alignment features 401, 402 on the front and bottom surfaces align the electrical contact pads with the corresponding electrical contact pads on the devices that will be mated to the connector.

Figures 5A, 5B:
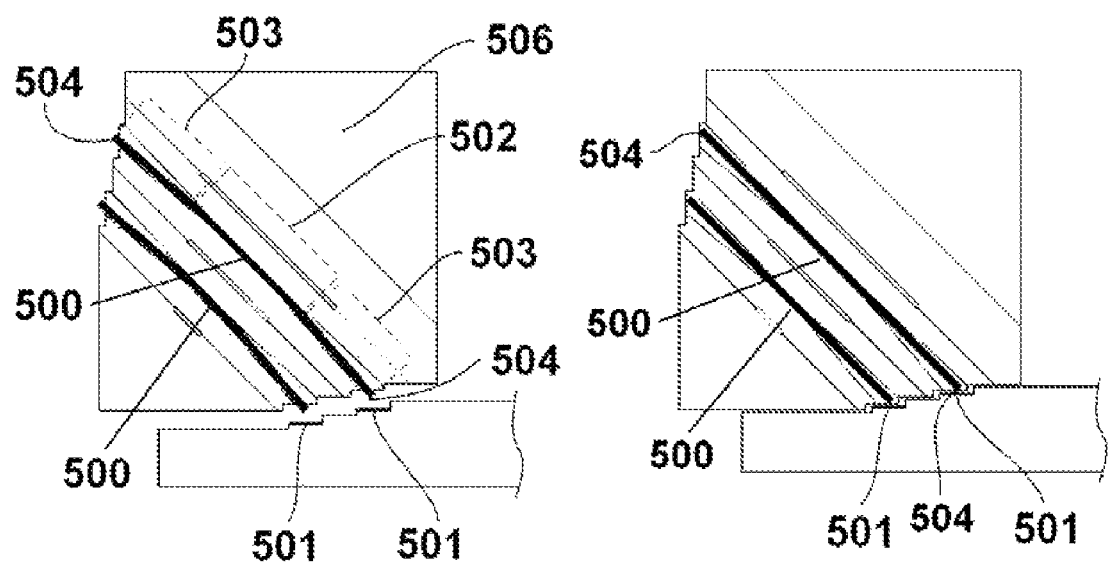
FIGS. 5A and 5B provide cross sectioned views of one embodiment, perpendicular to the connector's electrical signal contact interfaces.

FIGS. 5A and 5B provide cross section views of an embodiment of the invention showing separated and mated connections. In the cross section views, perpendicular to the front and bottom contact interfaces 201, 400 of electrical connector 200 in FIG. 4 showing the unmated cantilever-beam signal conductors 500. The cantilever-beam signal conductors 500 are comprised of a central portion 502 fixed with respect to the insulating connector body 506, two cantilever beams 503 attached to either end of the central portion 502 and two electrical contacts 504 at the extreme ends of the cantilever-beam signal conductors 500. The cantilever-beam signal conductors 500 can be single ended or differential signal pairs. In the unmated condition, (FIG. 5A) the printed circuit board's electrical contact pads 501 aren't touching the cantilever-beam signal conductors 500, which are curved downward.

FIG. 5B, illustrates the mated condition of an embodiment of the invention, in which the printed circuit board's electrical contact pads 501 force the electrical contacts 504 of the cantilever-beam signal conductors 500 upward thus producing a contact force and the necessary low contact resistance. When mated, the cantilever-beam signal conductors 500 are straight and equidistant from the cantilever-beam ground conductors 800 (shown in FIG. 8) to insure a uniform, transmission line geometry throughout the electrical connector. The electrical contacts 504 slide along the contact pads 501 when the connection is established, creating contact wipe and improving the connection. The cantilever-beam signal conductors 500 combine both electrical and mechanical functions in one entity. The cantilever beam conductor does not incorporate any sharp twists and turns, which enhances signal integrity for transmitted waveforms. In addition, the conductor's mechanical functions provide contact force and wipe. Both the cantilever-beam signal conductors 500 and ground conductors 800 (not visible in this view) are slanted at an angle to the printed circuit boards. This geometry provides the shortest physical and electrical length for the interconnect path between the contacts on the printed circuit board and the contacts on the electrical component attached by connector body 506.

Figure 6:
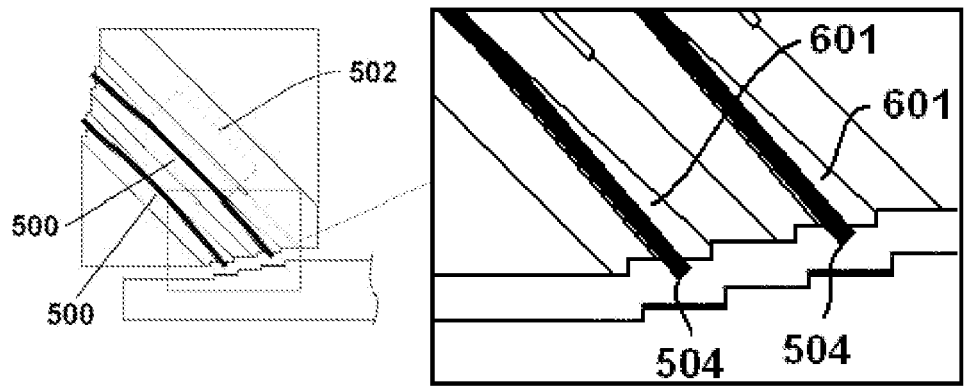
FIG. 6 illustrates a cross section and an enlarged view of the embodiment of the connector in FIG. 5A in its unmated state.

FIG. 6 provides an enlarged view of FIG. 5a, showing an embodiment of the invention in the unmated condition. The conductors 500 curve downward from the conductor's central portion 502; and its electrical contacts 504 protrude through openings in the electrical connector 200. A triangular space 601 around the ends of the cantilever-beam signal conductors 500 permits them to move upward as the printed circuit board mates with the electrical connector.

Figure 7:
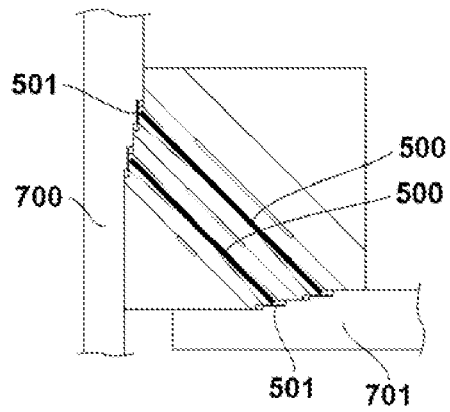
FIG. 7 illustrates a cross section of an embodiment wherein the electrical signal contact interfaces are mated with electrical contact pads of two stair-step printed circuit boards.
Figure 8:
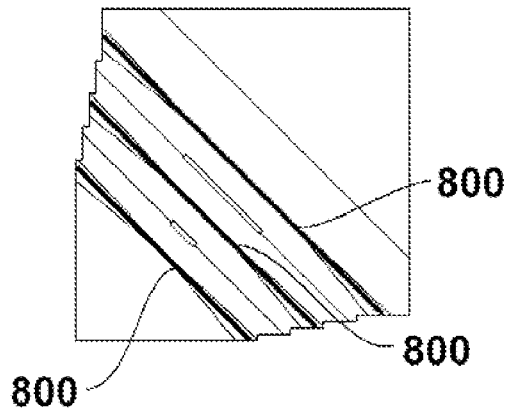
FIG. 8 provides a second cross sectional view of the embodiment in FIG. 7, showing the ground planes or conductive return paths.

FIG. 7 illustrates an embodiment of the invention in which the ends of the cantilever-beam signal conductors 500 are shown contacting the electrical contact pads 501 on a backplane 700 incorporating a stair-step structure and a line card 701 incorporating a stair-step structure FIG. 8 illustrates an embodiment of the invention in which cantilever-beam ground conductors 800 are shown. The cantilever-beam signal conductors 500 (which are visible in FIG. 7) for the differential signal pairs are not visible in FIG. 8 because they are offset from the cantilever-beam ground conductors 800.

Figure 9:
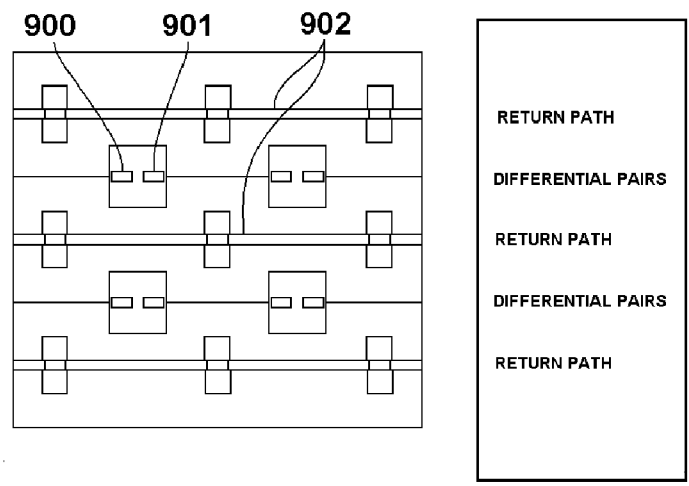
FIG. 9 illustrates a cross section perpendicular to the axis of an embodiment of the conductor beams with dielectric layers between the rows of signal conductors and return paths.

FIG. 9 illustrates an embodiment of the invention in which stripline is incorporated. The figure provides a cross sectional view perpendicular to the axes of the cantilever-beam signal conductors 500 in FIG. 7 and cantilever-beam ground conductors 800 in the electrical connector 200 in FIG. 2. It illustrates the physical relationships between different signal pairs and ground. The differential signal pair conductors 900, 901 and ground planes (also called return paths) 902 comprise a coupled stripline geometry. The characteristic impedance or the differential impedance relies in part on the distance between the ground planes 902, on material properties, and on dimensions of other constituent parts. An example of changing impedance is varying the spacing between ground planes 902.

Figure 9A:
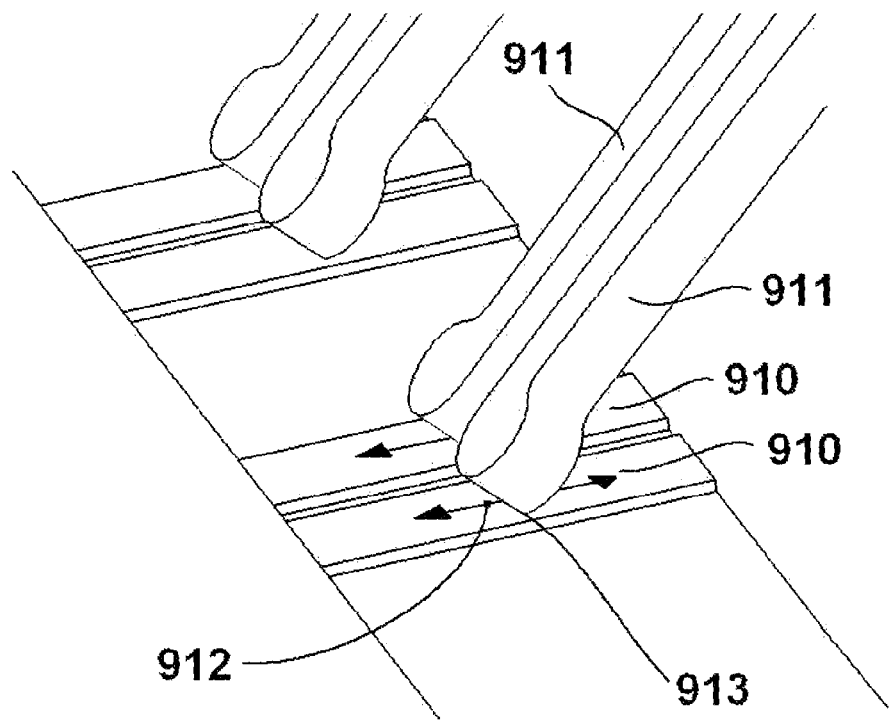
FIG. 9A illustrates the traces of a stair-step printed circuit board, wherein the traces act as long electrical contact pads axially in line with the embodiment's electrical conductors.

FIG. 9A illustrates an embodiment of the invention showing a view of the stair-step printed circuit board's traces 910, which emerge from under a layer of dielectric material at left and which act as long electrical contact pads axially in line with the conductors 911 of a cantilever-beam spring connector as shown in FIGS. 6, 7 and 8. The conductors 911 bend to produce contact force. The contact wipe movement 912, produced when the connector and printed circuit board are mated, is axially in line with the printed circuit board traces 910. This geometry allows a connector system using a smaller trace (contact pad) on the printed circuit board than would be possible if the wipe movement were in any other direction. The axial alignment of the pads and the contact wipe movement improves the effectiveness of the connection and minimizes the capacitive stub formed by the portion of the printed circuit board trace acting as a contact pad under the contact point 913.

Figure 10:
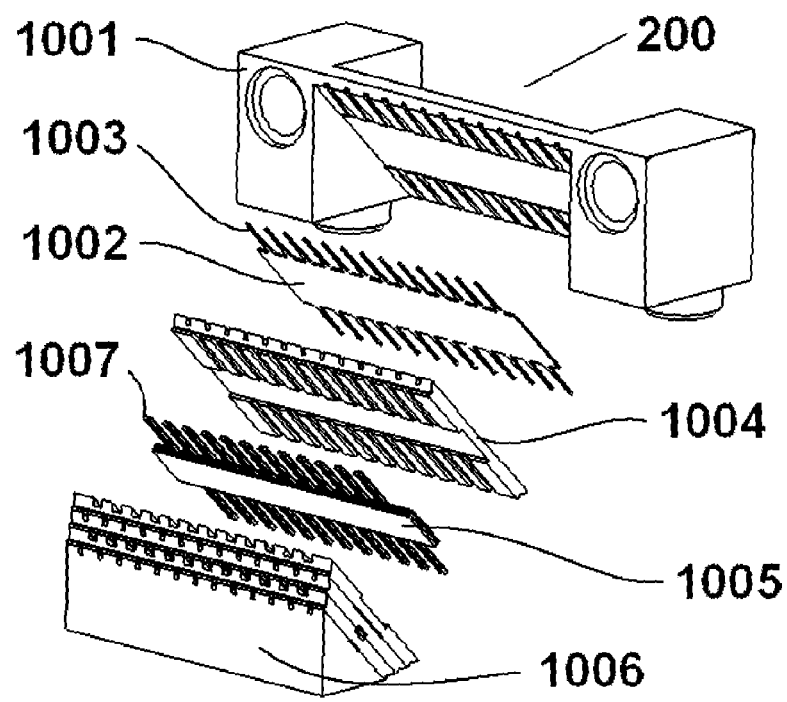
FIG. 10 illustrates a partially exploded view of the embodiment shown in FIG. 2.

FIG. 10 illustrates an exploded view of an embodiment in FIG. 2. The topmost part is the electrical connector housing 1001. The next part below it is the topmost ground plane 1002 with integral cantilever-beam ground conductors 1003. The next part below that is the dielectric layer 1004 with cavities and slots for the ground plane above it and the differential signal pair assembly 1005 below it. The rest of the parts are successive layers having the same functions and general shapes as those described above. The last part lowest in the figure is the containment bar 1006. The containment bar 1006 and the electrical connector housing 1001 restrains all the other parts. The differential signal pairs 1007 are equidistant between ground planes above and below them. These elements comprise differential stripline geometry.

Figure 11:
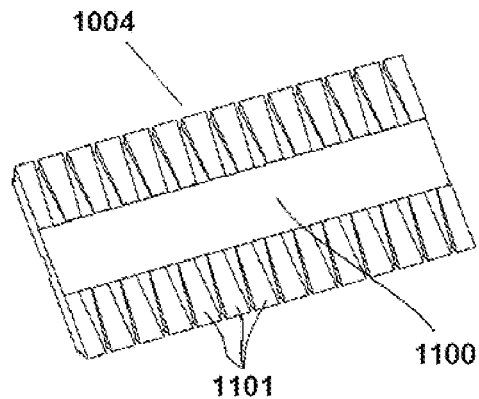
FIG. 11 illustrates an isometric view of the top of the dielectric layer 1004 contained in the embodiment shown in FIG. 10.

FIG. 11 further illustrates the dielectric layer 1004 shown in 10. A recess comprising the dielectric layer's broad cavity 1100 and its top planar surfaces 1101 can be made into one continuous conductive surface. When the ground plane 1002 in FIG. 10 is fit into the recess in the top of the dielectric layer 1004, it will electrically isolate electromagnetic radiation emanating from the differential signal pairs and reduce crosstalk. This configuration also reduces signal reflections and makes the differential impedance more uniform throughout the signal path.

Figure 12:
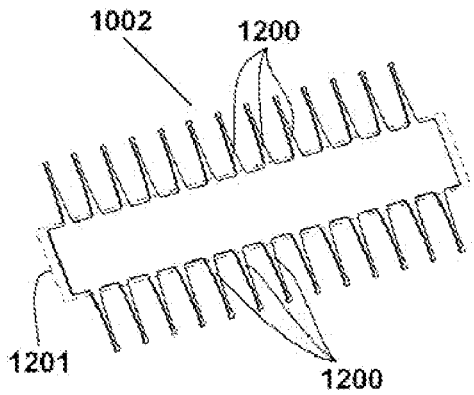
FIG. 12 illustrates a ground plane with rows of conductive beams representative of the ground planes contained in the embodiment shown in FIG. 10.

FIG. 12 further illustrates the ground plane 1002 shown in FIG. 10. The cantilever-beam ground conductors 1200 are attached to the ground plate 1201 and are tapered to reduce stress and shorten the beam length while retaining the same contact force as would a longer, uniformly-square cross-sectioned beam. This embodiment allows a smaller electrical connector producing the same contact force.

Figure 13:
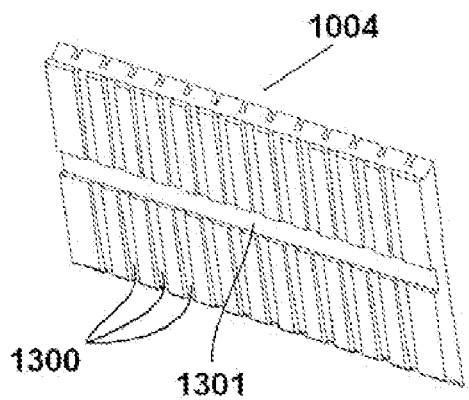
FIG. 13 illustrates an isometric view of the bottom of the dielectric layer 1004 contained in the embodiment shown in FIG. 10.

FIG. 13 further illustrates the dielectric layer 1004 shown in shown in FIGS. 10 and 11. This view shows the bottom of the dielectric layer with slots 1300 and cavity 1301 for accepting the differential pair assembly 1005.

Figure 14:
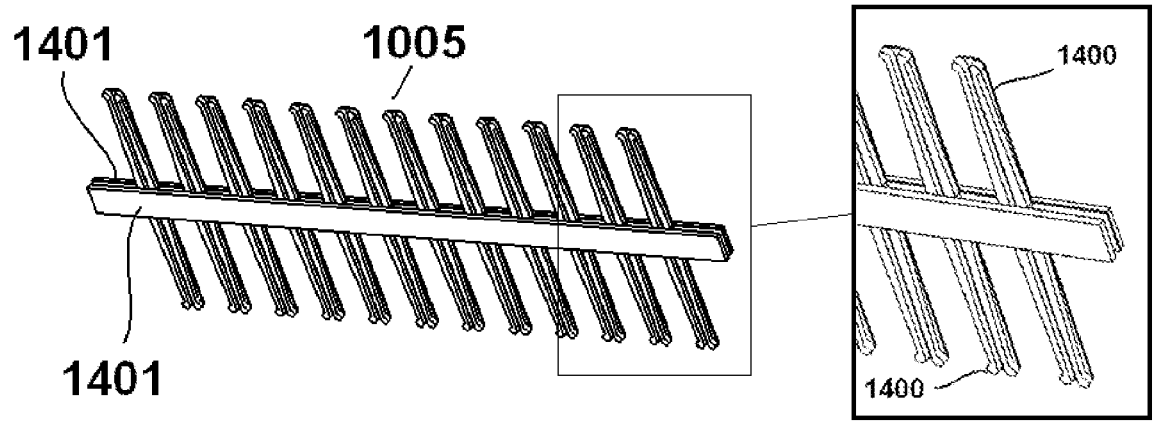
FIG. 14 illustrates detail of the differential pair assembly 1005 shown in FIG. 10, including locating plates, as well as an enlarged view of the right end of the assembly.

FIG. 14 further illustrates the differential pair assembly 1005 shown in FIG. 10, with an enlarged view of the differential signal pairs 1400. Assembly 1005 includes two rectangular-shaped locating plates 1401 that locate the differential pairs dimensionally.

Figure 15:
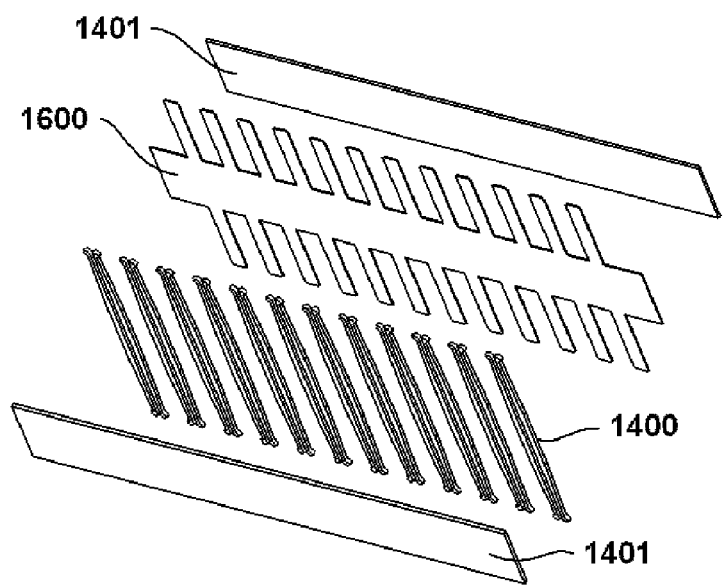
FIG. 15 provides an exploded view of the differential pair assembly in FIG. 14.

FIG. 15 illustrates an exploded view of the differential pair assembly 1005 in FIG. 14. All of the differential signal pairs 1400 are adhered to or sputtered to the locating sheet 1600, which can be a thin dielectric sheet such as polyimide. In one embodiment of the invention, a suitable etching solution, such as potassium hydroxide (KOH) can remove excess dielectric to produce the outline of the locating sheet 1600. In other embodiments of the invention, a laser, machine tool or stamping tool can also cut the locating sheet's outline.

Figure 16:
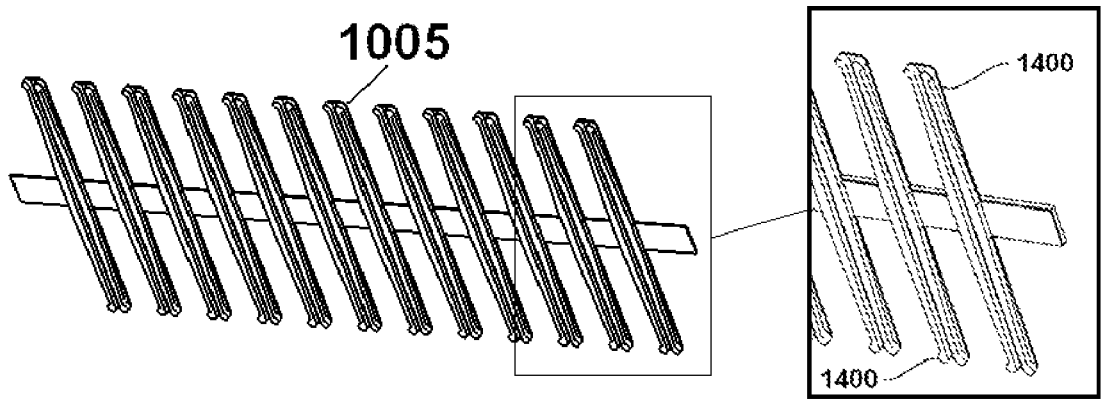
FIG. 16 is the same as FIG. 15 except with the locating plates removed.

FIG. 16 illustrates the differential pair assembly 1005 without the locating plates 1401 and the enlarged view shows two differential signal pairs 1400. In an embodiment of the invention, the differential pairs are etched from a metal foil sheet.

Figure 17:
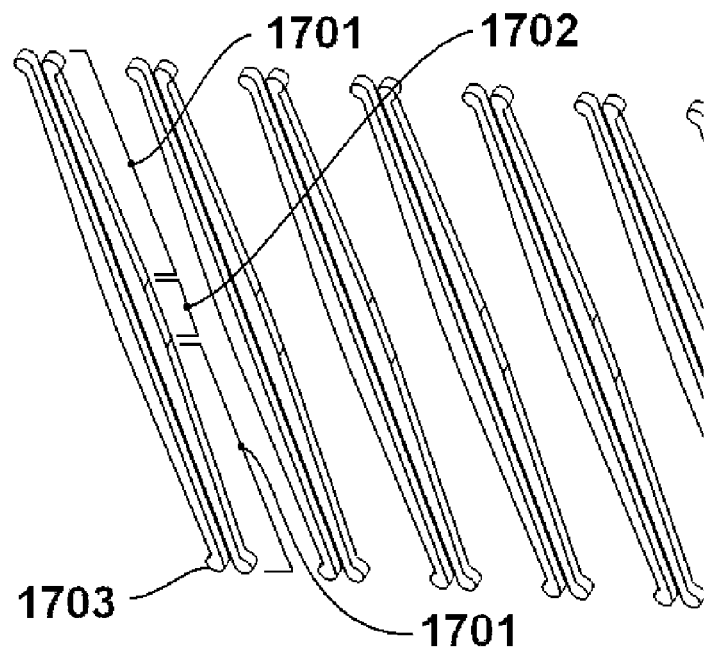
FIG. 17 is an enlarged view of the differential signal pairs in FIG. 15.

FIG. 17 shows the differential signal conductor beams 1701 and their relationships to each other in one embodiment of the invention. The differential signal conductor beams 1701 are tapered to reduce stress concentrations and shorten the conductor beam lengths while retaining the same contact force as would a longer, uniformly-square cross-sectioned beam. The center section 1702 of each differential signal conductor beam is attached to the locating plates 1401 which are in turn attached to the dielectric layers 1004.

Another aspect of the embodiment of the invention shown in FIG. 17 is the nature of the contact area at the ends of the conductors. The conductors may be shaped or etched into pointed or generally rounded ends 1703. As shown in FIG. 9A, when a conductor 911 is placed at an angle to a contact pad 910 on the printed circuit board and the two are brought together, the edge on the end of the conductor touches the pad at a theoretical single point of contact or minimal area of contact 913 in practice. This produces a large Hertzian contact stress value, which is advantageous for creating a highly reliable, gas-tight electrical contact. The necessary contact shape and the conductor are fabricated simultaneously in one operation whereas prior art often requires an additional fabrication step to produce a pointed or spherical contact shape.

Figure 19:
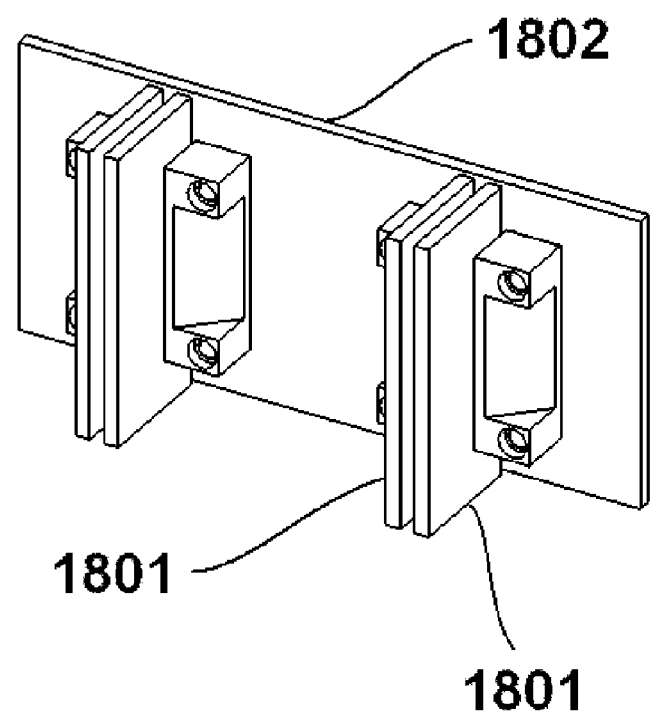
FIG. 19 illustrates the unexploded assembly in FIG. 18.

FIGS. 18 and 19 illustrate examples of stair-step line cards 1801 mated with a stair-step backplane 1802 in exploded and unexploded views respectively.

FIG. 20 shows the an embodiment of the stair-step line card of FIG. 18 having signal traces 2001 on the outer surface of the backplane 2002. The signal traces may also be embedded inside the backplane's multiple layers. As signals move through these signal traces, stair-step electrical connectors 2003, stair-step line cards 2004 and other signal traces they create a daisy chain configuration.

Figure 21:
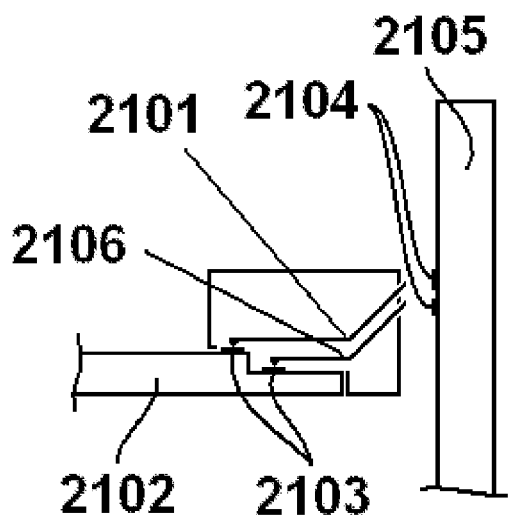
FIG. 21 is another embodiment of the invention illustrating a cross section with portions of the signal conductors bent at various angles to their mated printed circuit boards that have stair-step and planar contact arrays.

FIG. 21 illustrates an embodiment of the invention wherein two conductor beams 2101, 2106 are shown, each of which represents a row of conductors directly behind the ones shown. The horizontally inclined portions (with respect to the line card 2102) of the conductor beams 2101, 2106 are all of the same horizontal length in the same row. Contact points impinge on electrical contact pads or fingers 2103 on a stair-step line card 2102. Instead of electrical contacts, the conductor beams 2101 could be soldered or welded to the line card fingers 2103. The portion of the conductor beams 2101, 2106 that are inclined at an angle to the line card 2102 contact the electrical contact pads 2104 on the backplane 2105.

Figure 22:
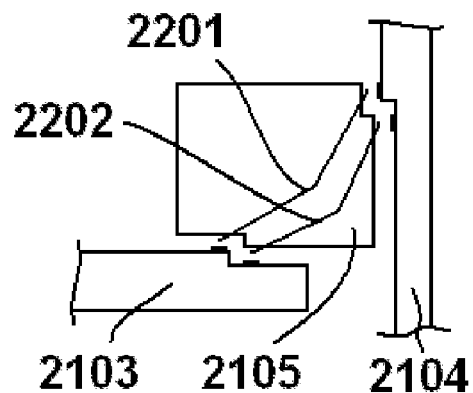
FIG. 22 is another embodiment of the invention illustrating a cross section with bent signal conductors mating with printed circuit boards that have stair-step contact pad rows.

FIG. 22 shows an embodiment of the invention wherein the horizontally inclined portion of the conductors in FIG. 21 could be tilted at different angles to provide different contact forces and distances between rows of conductor beams 2201, 2202. The conductors could remain straight or be in the shape of a V as shown with the vertex anywhere along the conductor beam. For instance, the angle formed with one printed circuit board 2103, could be 40° and the angle with the other printed circuit board 2104 could be 30° or there could be some other combination of angles. This would provide a greater or lesser contact force in the direction normal to the printed circuit board contact surface. In another embodiment of the invention, the conductor beam 2201, 2202 or portions of the conductor beam could be curved rather than straight. Even if the conductor cross section, length, and material properties are kept the same, a V-shaped conductor could provide greater contact force while fitting into a smaller volume. This is especially helpful in utilizing the stair-step electrical connector's triangular shaped volume 2105. There can be more than two rows of conductors in this example.

Figure 23:
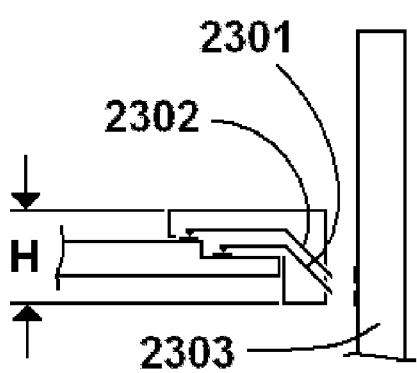
FIG. 23 is the same as FIG. 21 except that the rightward portion of the signal conductors is bent downward.

FIG. 23 illustrates an embodiment of the invention similar to the electrical connector in FIG. 21 except that the inclined portion 2301, 2302 of the conductor beams are bent downward toward the backplane 2303, which significantly reduces the height (H) of the electrical connector.

Figure 24:
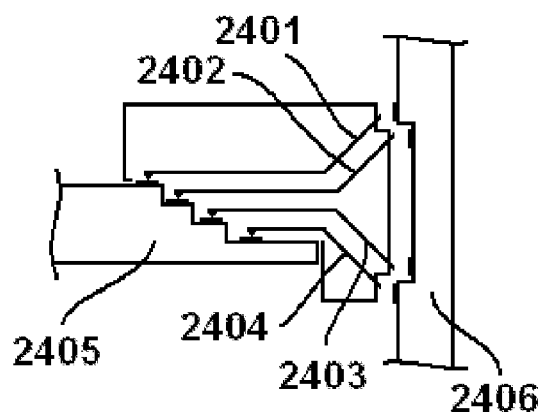
FIG. 24 illustrates a cross section an embodiment with conductors bent upward and downward to route the signals in different directions on the backplane.

FIG. 24 shows an embodiment of the invention wherein the inclined portion of the conductor beams 2401, 2402, 2403 and 2404 are bent both upward and downward. This configuration allows the signals to route directly from one side of the line card 2405 to signal traces that travel in opposite directions on the backplane 2406.

Figure 25:
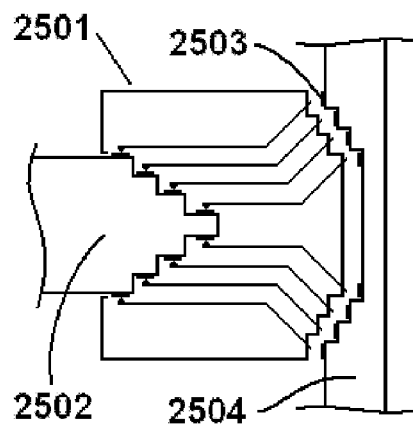
FIG. 25 illustrates a cross section of an embodiment of the electrical connector showing how signals are routed from both sides of a printed circuit board to signals traveling in different directions on a backplane.

FIG. 25 illustrates an embodiment of the invention wherein the stair-step electrical connector 2501 interfaces with both sides of the line card 2502 and routes the signals to stair-step contact pads 2503 and sends the signals in either direction on the stair-step backplane 2504.

Figure 26:
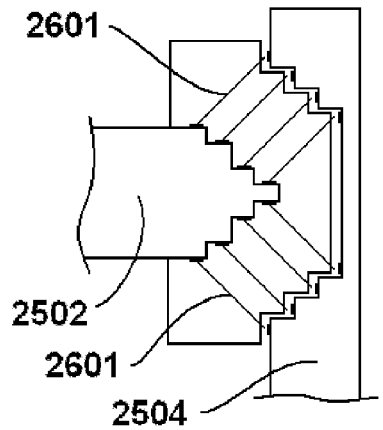
FIG. 26 is similar to FIG. 25 except that the conductors are straight.

FIG. 26 illustrates an embodiment of the invention wherein the printed circuit board configurations are the same as in the previous embodiment of the invention in FIG. 25 except the conductor beams 2601 are straight rather than bent.

Figure 27:
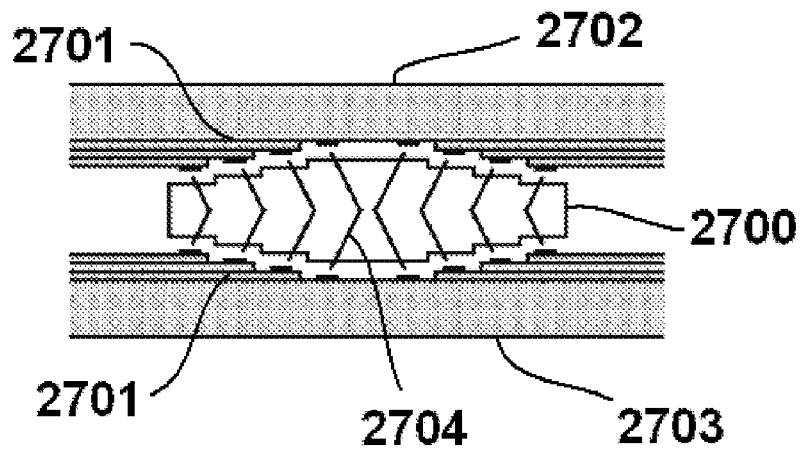
FIG. 27 illustrates a cross section of an embodiment of a stair-step interposer using, but not limited to column-buckling spring members as conductors; and interconnecting two stair-step printed circuit boards.

FIG. 27 illustrates an embodiment of the invention wherein a stair-step interposer 2700 connects directly to the signal traces 2701 of two parallel stair-step printed circuit boards 2702, 2703 thus avoiding the need for plated through holes. The conductors 2704 shown are similar to the V-shaped conductor spring beams 2201 shown in FIG. 22 except that the printed circuit boards 2702, 2703 are parallel to each other. The conductors 2704 can be any type of spring-like member that interconnects to the electrical contact pads on the stair-step surfaces of the printed circuit boards 2701, 2703.

Figure 28:
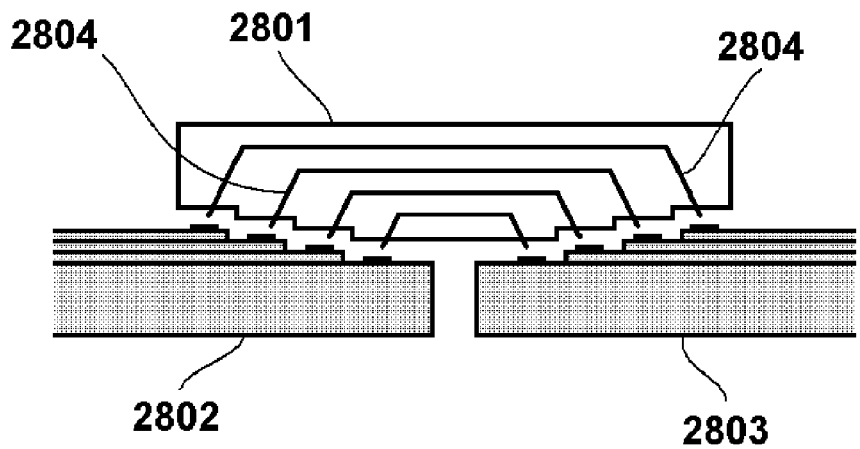
FIG. 28 illustrates a cross section of an embodiment of a one-sided, stair-step electrical connector that interconnects signals between two stair-step printed circuit boards.

FIG. 28 illustrates an embodiment of the invention wherein a stair-step electrical connector 2801 interconnects to the electrical contact pads of two stair-step printed circuit boards 2802, 2803. The conductors are slanted, cantilever beam conductors 2804 with spring-like properties.

Figure 29:
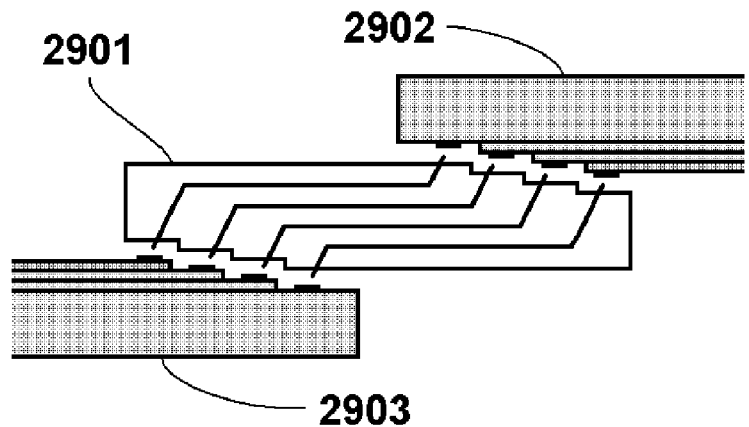
FIG. 29 illustrates a cross section of an embodiment of a stair-step electrical connector interconnecting signals between two stair-step printed circuit boards; one printed circuit board being inverted with respect to the other.

FIG. 29 illustrates an embodiment of the invention wherein a stair-step electrical connector 2901 is similar to the one in FIG. 28 except the printed circuit boards 2902, 2903 are inverted with respect to the other.

Figure 30A:
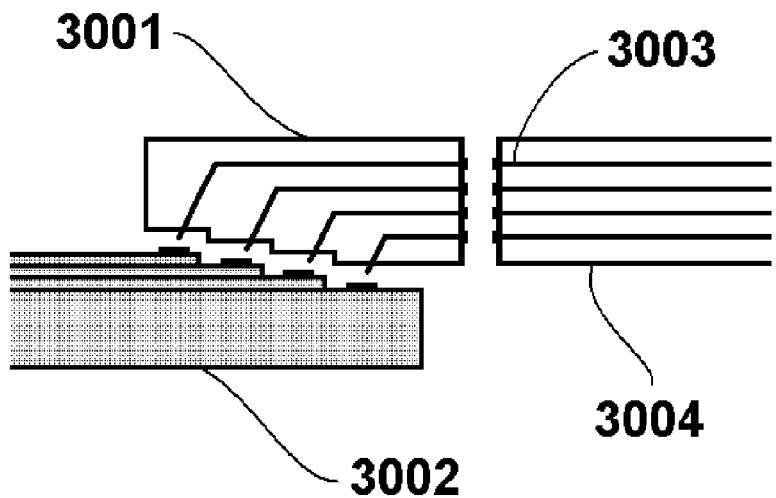
FIG. 30A illustrates a cross section of an embodiment of a stair-step electrical connector interconnecting with a stair-step printed circuit board and with signal wires in a cable. The stair-step electrical connector may have permanent connections between the stair-step electrical connector and the signal wires in the cable.

FIG. 30A illustrates an embodiment of the invention wherein a stair-step electrical connector 3001 interconnects a stair-step printed circuit board 3002 directly to the ends of wires 3003 in a cable 3004.

Figure 30B:
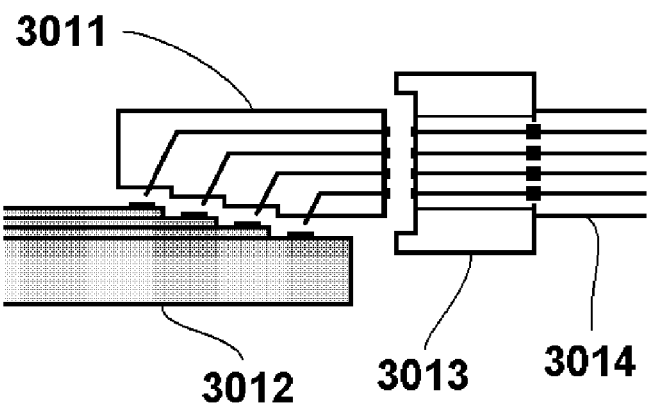
FIG. 30B illustrates a cross section of a stair-step electrical connector interconnecting with a stair-step printed circuit board and with conductors in a cable connector.

FIG. 30B illustrates another embodiment of the invention wherein a stair-step electrical connector 3011 interconnects a stair-step printed circuit board 3012 directly to an electrical connector 3013 attached to a cable 3014. The conductors in the electrical connector 3001 or 3011 may be articulated in another direction, relative to the printed circuit boards, than is shown in FIG. 30A or 30B so that the axis of the cable 3004 or electrical connector 3013 can be at any other angle to the stair-step electrical connectors or the printed circuit board.

Figure 31:
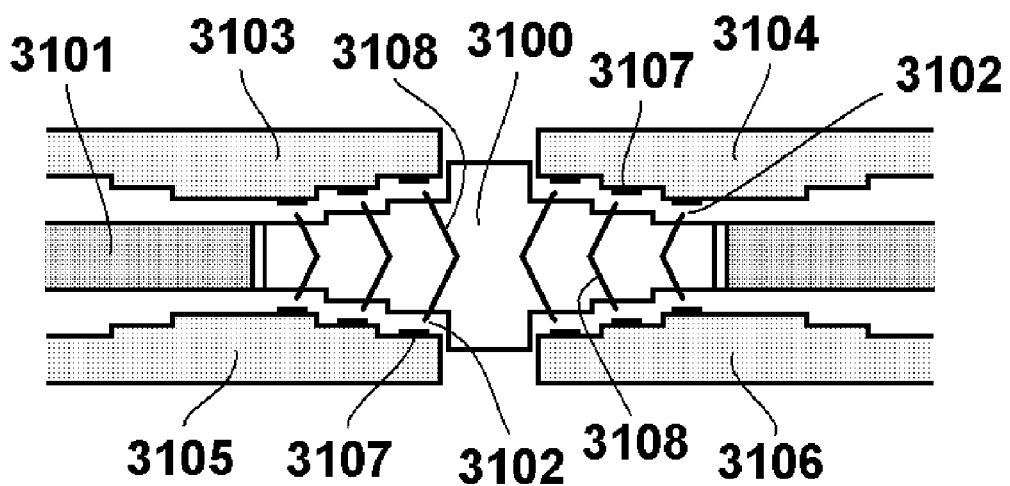
FIG. 31 illustrates a cross section of an embodiment of a stair-step electrical interposer positioned within the hole of a printed circuit board. From this position, the interposer interconnects two or more integrated circuit packages or other printed circuit boards.

FIG. 31 illustrates another embodiment of the invention, a stair-step electrical interposer 3100 which resides in a hole in a printed circuit board 3101 so that stair-step electrical interposer's contacts 3102 are exposed on either side of the printed circuit board 3101. Other printed circuit boards or IC packages 3103, 3104, 3105, 3106 having stair-step electrical contacts 3107 can interface with the stair-step electrical interposer 3100. This configuration allows signals to travel to the other side of printed circuit board 3101 with improved signal integrity. The conductors 3108 are similar to the V-shaped conductor spring beams 2201 shown in FIG. 22 except that the printed circuit boards 3103, 3104 are parallel to printed circuit boards 3105, 3106. The conductors 3108 can be any type of spring-like conductive member that interconnects to the electrical contact pads on the stair-step surfaces of the printed circuit boards 3103, 3104, 3105, and 3106.

Figure 32:
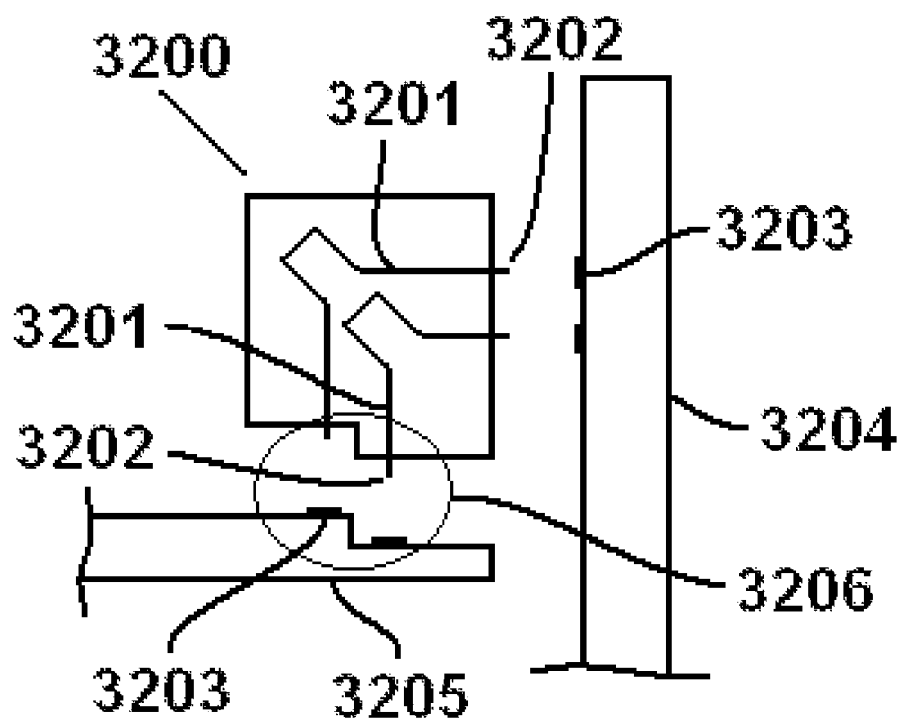
FIG. 32 illustrates a cross section of an embodiment of an electrical connector with conductors whose spring force function is concentrated at the corner of the bent conductors. The additional feature is the incorporation of the stair-step which precludes the necessity for plated through holes in the printed circuit boards.

FIG. 32 illustrates an embodiment of the invention, an electrical connector 3200 whose electrical conductors 3201 are fabricated from one piece of metal or conductive material. Each conductor is a spring that creates contact force on the ends 3202 of the conductor, when either leg of a conductor is displaced by mating it with electrical contact pads 3203 on the printed circuit boards 3204, 3205. The electrical connector has a stair-step configuration 3206 of electrical contacts that allow it to electrically interface with the stair-step arrangement 3206 on the printed circuit board 3205. The printed circuit board 3204 and the interconnection interface on the right side of electrical connector 3200 illustrate how the two components may mate without a stair-step arrangement.

Figure 33:
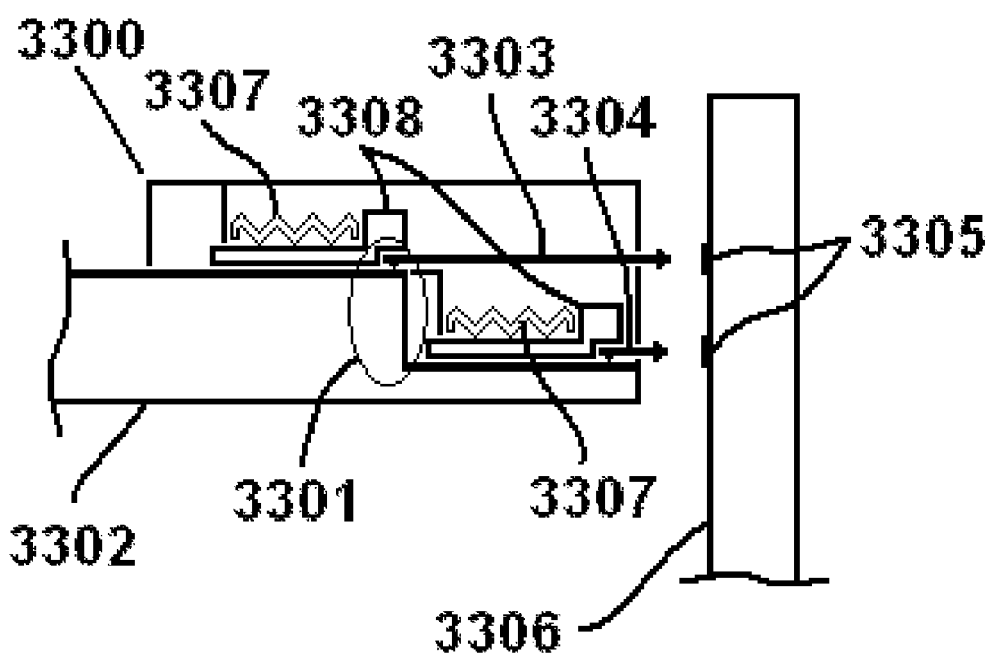
FIG. 33 illustrates a cross section of an embodiment with the conductor beams shown at, but not limited to zero and 90 degrees inclination to the printed circuit boards. The spring members are separated from the conductors by an intervening insulated part.

FIG. 33 shows an embodiment of the invention of an electrical connector 3300 that eliminates the need for plated through holes (vias) by adding a stair-step feature 3301 to the line card 3302. The conductors 3303, 3304 are straight (rather than v-shaped) and inclined at a zero angle to the line card 3302. The conductors make contact with the electrical contact pads 3305 on the backplane 3306. The other end of the conductors 3303, 3304 simultaneously wipes and makes contact with the signal trace on the line card 3302. Springs 3307 are separated from the conductors 3303, 3304 by insulating members 3308. The springs 3307 push against the insulating members 3308, which push against the conductors 3303, 3304 to provide contact force against the backplane's electrical contact pads 3305. The electrical contact pads 3305 are shown in a planar configuration, but could also be on different layers in a stair-step fashion as shown in FIG. 3. The spring 3307 could be any type of mechanism such as a helical spring, torsion spring, cantilever beam spring, elastomer or a bladder filled with a liquid or gas. Rather than having a separate spring member for each conductor, the springs could be fabricated as one entity wherein portions of the spring member could be articulated to move separately and provide force for each conductor in a row or for conductors in any segregated group. Thus the spring member is less costly to manufacture, assemble and handle since one item is fabricated for a group of conductors rather than separate springs for each conductor. Since the springs are separated from the conductors, mechanical requirements do not force the conductors to have awkward shapes that are detrimental to uniform impedance requirements.

Figure 34A:
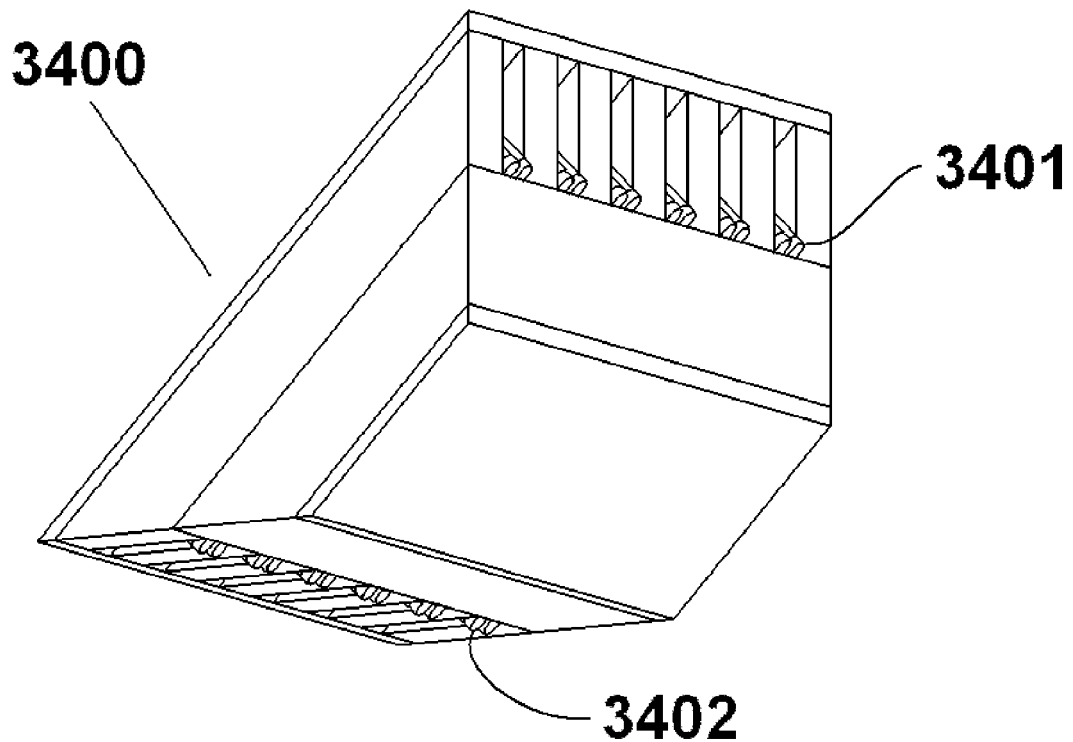
FIG. 34A illustrates an embodiment of a stair-step electrical connector with one row of differential signal pair conductors that are rigid in nature.

FIG. 34A illustrates an embodiment of the invention in which the electrical connector 3400 interconnects printed circuit boards (not shown) oriented at an angle to each other and whose conductor beams 3401, 3402 are rigid or stiff in nature. A separate spring (not shown) provides the contact force for each conductor beam 3401 or 3402.

Figure 34B:
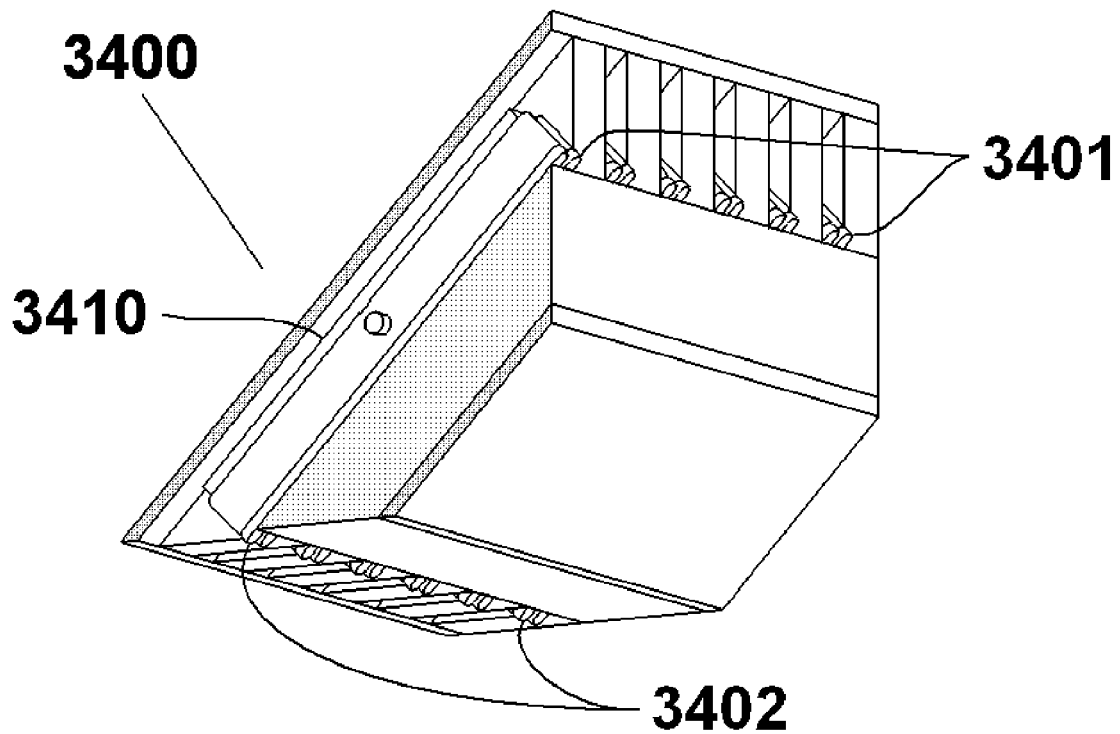
FIG. 34B illustrates a cross section through the electrical connector in FIG. 34A exposing the differential pair conductor assembly composed of two conductor beams

FIG. 34B illustrates a cross section through the electrical connector 3400 exposing the differential pair conductor assembly 3410 composed of two conductor beams 3401 and 3402. The conductor assembly may also be composed of one conductor or more than two conductors.

FIGS. 35A, 35B illustrate a differential pair conductor assembly 3410 comprised of five parts. There are two insulating beams 3501 made of ceramic or other suitably stiff or high elastic modulus insulating material. Two conducting beams 3401, 3402 are adhered in some fashion to the bottoms of the insulating beams 3501. Or the conducting beams are made by conductively coating, sputtering or plating the bottoms of the insulating beams 3501. Next, a pivot rod 3503 is inserted into the hole in the center of the insulating beams 3501. Each conductor beam 3401, 3402 in the differential pair assembly 3410 can rotate about the pivot rod 3503. This allows conductor beam 3401 to rotate separately from the other conductor beam 3402 as shown in FIG. 35B. This action insures that when each conductor contact 3504 (at either end of the conductor beams 3401, 3402) touches and mates with a mating contact pad, it doesn't hinder the movement or decrease the contact force of the conductor contact 3504 next to it.

FIG. 35C illustrates a single conductor assembly 3520 composed of pivot rod 3521, insulating beam 3522 and conductor beam 3523.

FIG. 36A shows the same cross section view of electrical connector 3400 in FIG. 34B. The curved leaf springs 3601 provides force to the top of the differential pair assembly 3410 or to the top of the single conductor assembly 3520 in FIG. 35C. The electrical connector 3400 is shown just as the electrical contacts on the ends of the conductor beam 3402 begins to touch the mating electrical contact pads 3603 on the printed circuit boards 3602.

FIG. 36B shows the electrical connector 3400 fully actuated and mated. The printed circuit boards' mating electrical contact pads 3603 have pushed the conductor assemblies, either 3410 or 3520 so that the leaf spring 3601 is flattened out or nearly flattened out and has created adequate contact force at either end of the conductor beam 3402.

Figure 37:
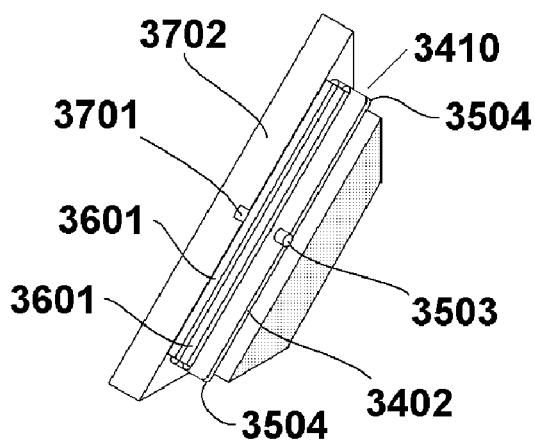
FIGS. 37 and 38 illustrate the slots in the dielectric layer that serve as guides for the pivot rod in the rigid conductor assembly.
Figure 38:
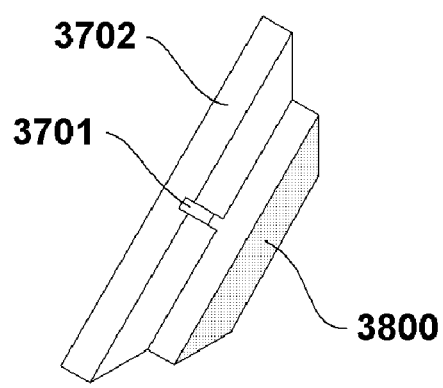

FIGS. 37 and 38 illustrate the interaction between the differential pair assembly 3410 and a slot 3701 in the surrounding dielectric 3702. In FIG. 38, the dielectric 3702 is shown in cross section 3800 so that the dielectric's right half is not shown. Either end of the pivot rod 3503 slides inside the slots 3701 in the surrounding dielectric 3702. One slot 3701 is shown partially in FIG. 37 and fully in view in FIG. 38 and the other slot is in the dielectric (not shown) on the opposite side of the differential pair assembly 3410 and captures the other end of the pivot rod 3503. The two actions: 1.) the conductor beams 3401, 3402 rotating about the pivot rod 3503 and 2.) pivot rod 3503 sliding in the dielectric's slots 3701 allow the contacts 3504 at each end of the conductor beams 3401, 3402 to electrically interface with electrical contact pads 3603 on printed circuit boards 3602. The leaf springs 3601 can be any type of spring including 2 or more leaf springs, helical springs, torsion springs, elastomers or other force mechanisms such as bladders filled with a compressible material such as air. The separation of the force-producing spring 3601 from the conductor beams 3401, 3402 allows the designer to separate the electrical design constraints of the conductor beams from the mechanical design constraints of the spring, thus the spring 3601 can be nonconductive. The conductor beams 3401, 3402 in the conductor assembly have a uniform cross section throughout their length thus insuring uniform differential impedance. In the previous design, a conductor combined both electrical and mechanical purposes. They were tapered to lower the stress, but the taper doesn't produce as uniform a cross sectional shape or as uniform a differential impedance throughout the length of the differential signal pair as conductor beams 3401, 3402.

Figure 39:
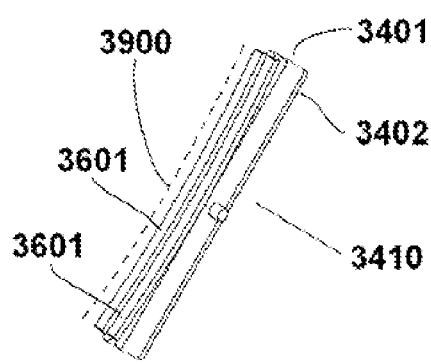
FIG. 39 illustrates an isometric view of an embodiment of the differential signal pair assembly with leaf springs in place.

FIG. 39 illustrates, in isometric view, the differential pair assembly 3410 with conductor beams 3401, 3402 one behind the other. The leaf springs 3601 are in their unstressed, rest positions with their concave sides 3900 pointed upward.

Figure 40:
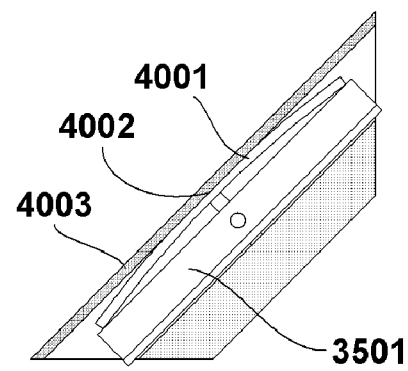
FIG. 40 illustrates an embodiment of an electrical connector cross section of the leaf spring in an inverted position.

In FIG. 40, the leaf springs 4001 are reversed, so the spring's midpoint 4002 touches the uppermost restraining layer 4003. Both ends of the leaf spring project downward toward the ends of the insulating beams 3501.

Figure 41:
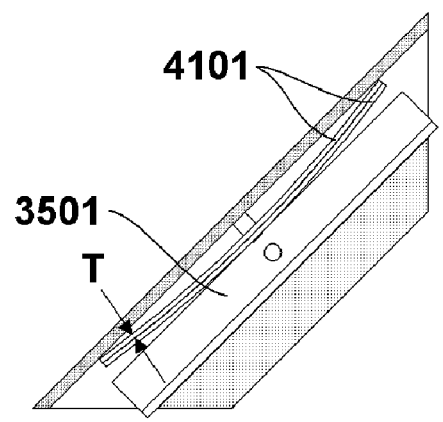
FIG. 41 illustrates an embodiment of an electrical connector cross section of the differential signal pair assembly with two leaf springs disposed in sandwich fashion on top of each other.

FIG. 41 illustrates an embodiment of the invention wherein two or more leaf springs 4101 are placed one atop the other. The leaf springs 4101 are thinner than those previously discussed to reduce stress levels in the outside fibers of the metal.

The force upon the insulating beam 3501 is multiplied by the number of leaf springs 4101 placed together on top of each other. As an example, two leaf springs 4101, one atop the other, have twice the force of one leaf spring 4101 for the same deflection while stress in the outside surface of one leaf spring 4101 is less than the stress in one leaf spring with twice the thickness T.

Figure 42A:
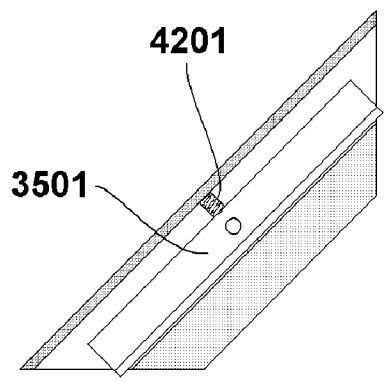
FIG. 42A illustrates an embodiment of an electrical connector cross section of the rigid conductor assembly with a helical spring centered on the conductor beam and replacing the leaf spring.
Figure 42B:
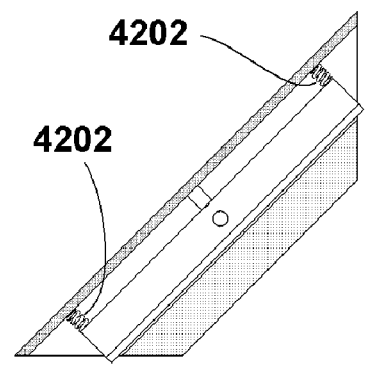
FIG. 42B illustrates an embodiment of an electrical connector cross section of the rigid conductor assembly with helical springs disposed at the ends of the rigid conductor beams.

In FIG. 42A, a helical spring 4201 replaces the leaf spring 3601, 4001 or 4101 at the center of the insulating beam 3501. In FIG. 42B, two helical springs 4202 are located at the ends of the conductor beam. The helical springs can be replaced with any other spring-like member such as a column-buckling spring, a torsion spring, a conductive elastomeric button or other force mechanisms such as bladders filled with materials such as gases or liquids.

Figure 43A:
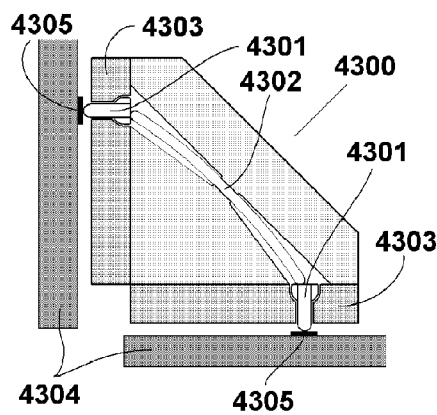
FIG. 43A and FIG. 43B illustrate an embodiment of an electrical connector cross section showing how conductive push pins, which are guided by holes in location plates, actuate spring-like, conductor beams in unmated and mated conditions respectively.
Figure 43B:
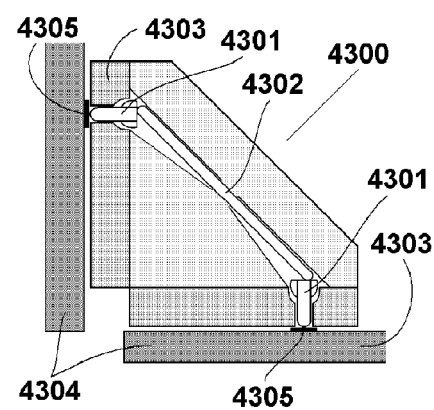

FIG. 43A illustrates an embodiment of the invention wherein two push pins 4301 are located at the ends of the slanted conductor beam 4302. The push pins 4301 are captured within guiding holes of two location plates 4303 that are angularly disposed to each other. In FIG. 43B, when the electrical connector 4300 is mated with electrical contact pads 4305 on printed circuit boards 4304, the push pins 4301 move toward the conductor beam 4302. The conductor beam 4302 is held or fixed at its center and is free to bend at either end. As the push pins 4301 move, they bend the cantilevered ends of the conductor beam 4302 upward, which in turn provide force for low contact resistance between the ends of the conductor beam 4302 and the electrical contact pads 4305. As the push pins move, the contact ends of the conductor beams 4302 slide across the mating surface of the tops of the push pins 4301 thus providing contact wipe.

Figure 44A:
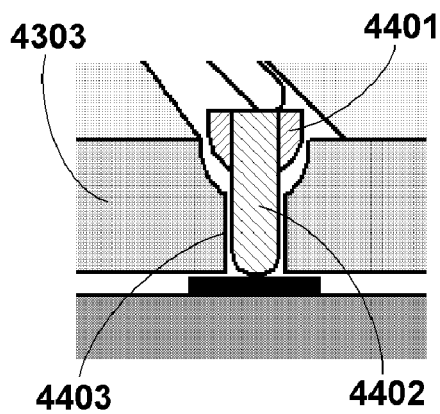
FIG. 44A illustrates a cross section of an enlarged view of the push pin in the mated condition.
Figure 44B:
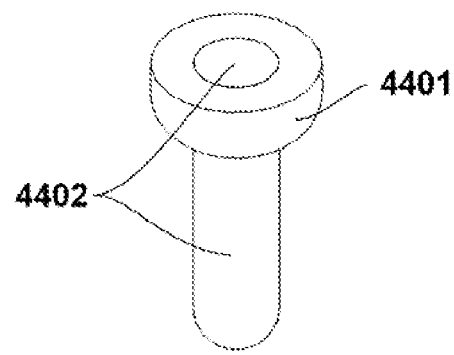
FIG. 44B illustrates an isometric view of the push pin in FIG. 44A.

FIGS. 44A, 44B illustrates an added property wherein an insulating collar 4401 is placed around the push pins 4402. This collar acts as a stop that prevents the push pins from being pushed out of the location plates 4303. The insulating collar 4401 is made of a material with the correct dielectric constant to match that of the location plate. Thus the push pin 4402, which is conductive, will have a better matched-impedance than those of a push pin made with an integral conductive collar. An integral conductive collar would bounce back signal waveforms causing disruptive reflections and degrade signal integrity. The push pins 4402 could be made very small, which is advantageous for making a uniform transmission line that produces uniform characteristic impedance. Manufacturing technology allows the guiding holes 4403 in the locating plates 4303 to be very accurately fabricated with regard to size and their location with respect to each other. The locational accuracy of the electrical contacts in electrical connector 4300 is much greater than any of the other arrangements previously shown in this and other disclosure documents that describe electrical connectors.

FIGS. 45A and 45B illustrate an embodiment of the invention wherein the push pin 4501 slides and revolves inside a guiding hole 4505 in the locating plate 4506. Locating plate 4506 has the same function as locating plate 4303 in electrical connector 4300. Projecting tabs 4502 would fit into slots 4504 in guiding hole 4505. The slots 4504 (there are two in guiding hole 4505) would be twisted with respect to the hole's axis. In FIGS. 45C and 45D, the printed circuit board contact pad 4507 mates with the push pin 4501 causing it to move upward inside the guiding hole 4505 in the locating plate 4506. Simultaneously, the projecting tabs 4502 would revolve with respect to the push pin's axis because of the slot's twisted geometry. This action makes the push pin 4501 twist, producing contact wipe in two places as shown by the arrows: 1.) between the push pin and the printed circuit board's contact pad 4507, 2.) between the cantilever beam 4508 and the top of the nail head 4503 on the push pin 4501.

FIG. 46 illustrates an embodiment of the invention wherein the angled conductor beams 4601 can be fixed to the electrical connector body 4602 and do not move relative to it. Two locating plates 4603, which are at an angle to each other, are fixed to the electrical connector body 4602. Spring members 4604 are placed in locating holes in the locating plates 4603 and make electrical contact with the ends of the angled conductor beams. When the electrical connector 4600 is mated to the electrical contact pads 4605 of printed circuit board 4607, it deflects the spring members 4604 to electrically connect the electrical contact pads, spring members and angled conductor beams. Printed circuit board 4606 illustrates the unmated condition before the spring member deflects. Alternatively, the spring members 4604 may be placed in or on the printed circuit boards and the angled conductor beams 4601 configured in various ways to allow electrical contact with the spring members. Alternatively, the spring members 4604 could be any force-producing mechanism such as a fuzz button, a helical spring, a column-buckling spring, a bellows spring, a conductive elastomeric button, a zebra elastomeric strip, a pogo pins, a bladder with a material within that is capable of being compressed, a PariPoser contactor from Paricon Technologies Corp or the like. Placing spring members inside holes in the locating plate 4603 increases the locational accuracy of the electrical connector's contacts with respect to each other.

Figure 47:
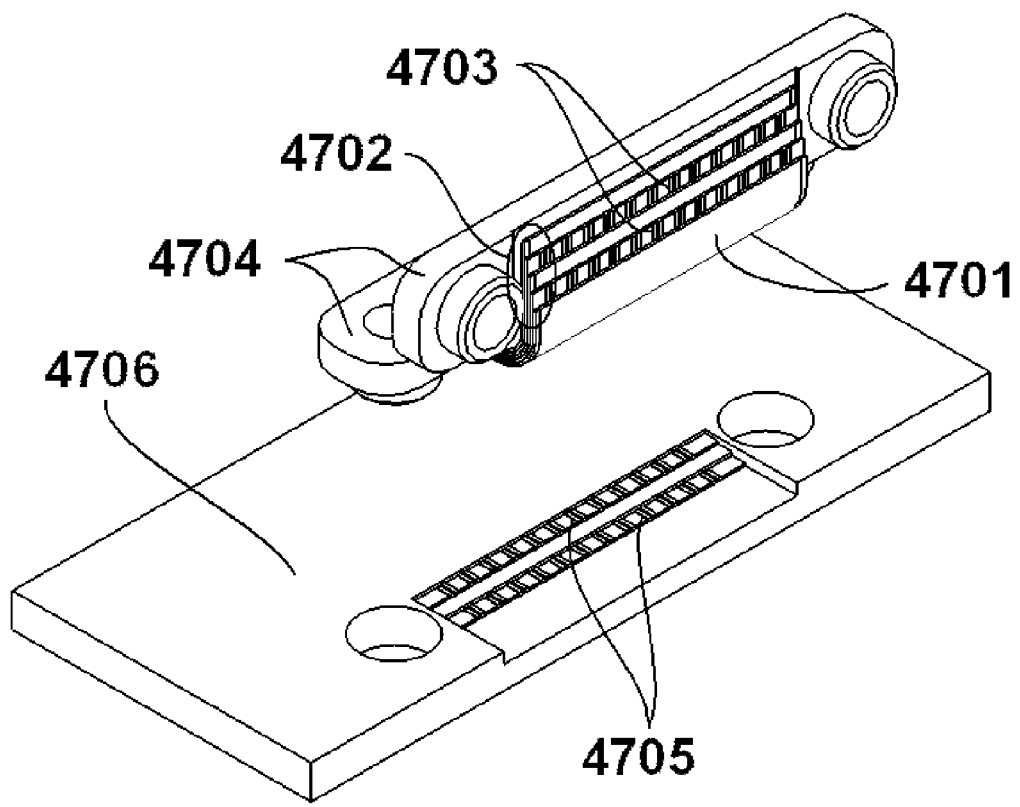
FIG. 47 illustrates an embodiment of a stair-step flexible circuit with clamping plates and a stair-step printed circuit board.

FIG. 47 illustrates another embodiment of the invention that uses multiple, stacked layers of metal foils and dielectric sheets in a flexible circuit 4701. At either end of the flexible circuit, each metal layer is exposed by extending it beyond the adjacent layer. This creates a stair-step configuration 4702 at either end of the flexible circuit whose rows of electrical contacts 4703 interface with rows of electrical contact pads 4705 on stair-step printed circuit boards 4706. Either figure shows the rows of contacts 4703 at either end of the flexible circuit 4701 being 90 degrees to each other, but they may be at any other angle or even in the same plane. Thus printed circuit boards 4706 may be at angles other than 90 degrees. The flexible circuit 4701 can be lengthened, branched and articulated into many different configurations. Separate clamping plates 4704 clamp the ends of the flexible circuit 4703 to printed circuit boards, circuits in general, other flexible circuits, cables, other electronic components or electrical connectors.

Figure 48:
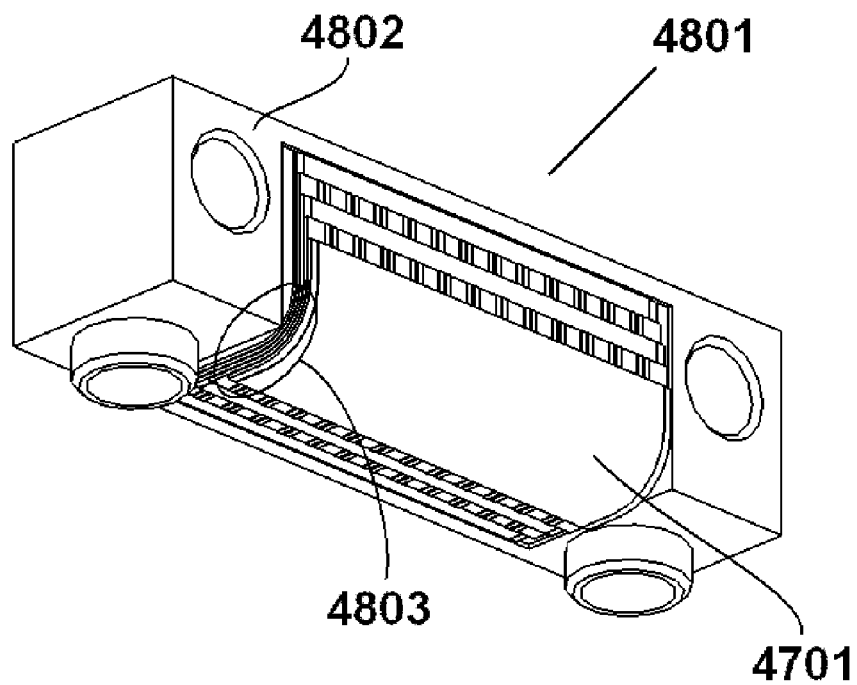
FIG. 48 illustrates an embodiment of a stair-step flexible circuit connector with electrical connector body.

FIG. 48 illustrates another embodiment of the invention, a stair-step flexible circuit connector 4801 wherein the stair-step flexible circuit 4701 is integral with an electrical connector body 4802. As in the embodiment of the invention shown in FIG. 47, the rows of contacts at either end of the flexible circuit 4801 are 90 degrees to each other, but they may be at any other angle or even in the same plane. Thus printed circuit boards may be at angles other than 90 degrees. The curved portion 4803 of the flexible circuit 4701 between the rows of contacts is shown as rounded. However, it may be flat so that the signals may travel the smallest possible distance between contacts that are at the ends of the flexible circuit.

Figure 49:
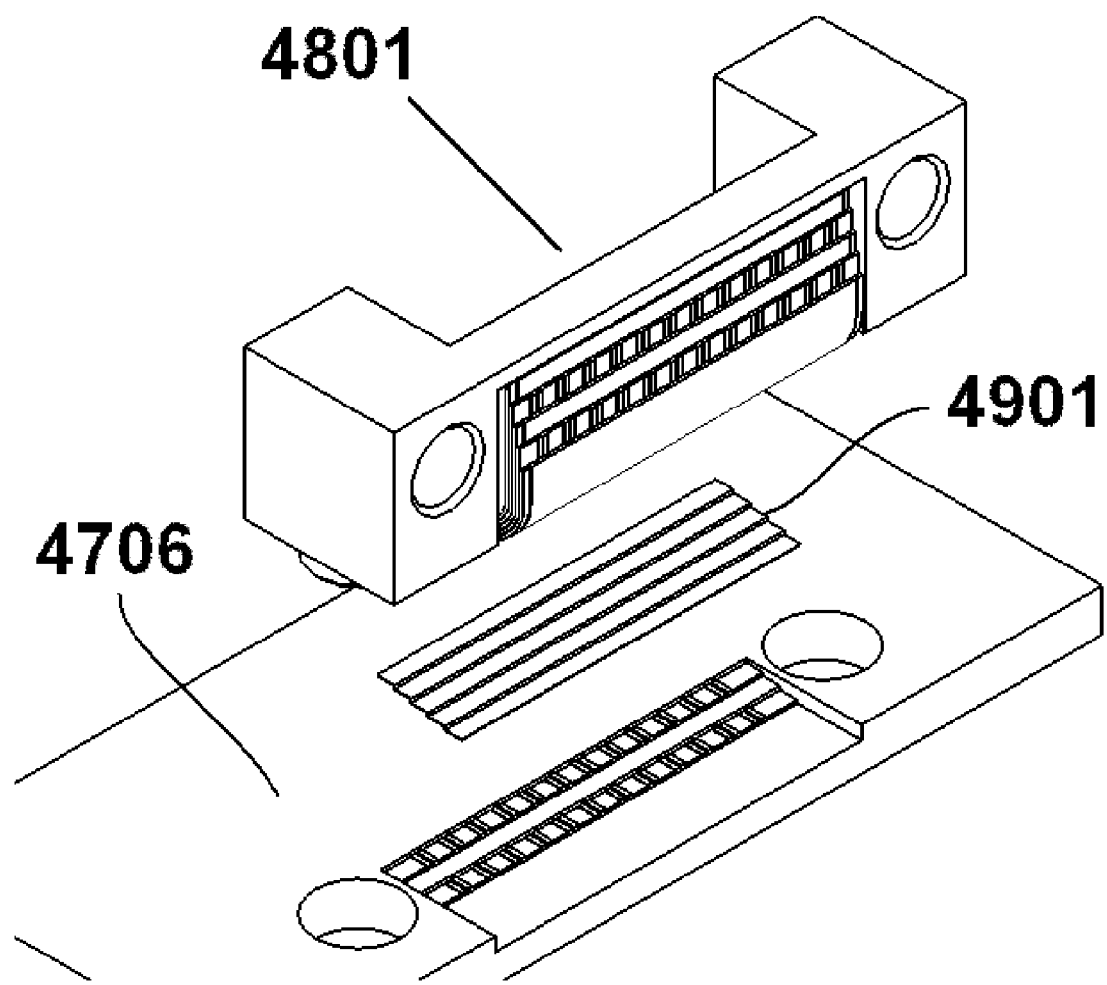
FIG. 49 illustrates an exploded view of a stair-step flexible circuit connector above a stair-step printed circuit board with an interposer positioned between them.

FIG. 49 illustrates an exploded assembly showing the stair-step flexible circuit connector 4801 and a stair-step printed circuit board 4706. An interposer 4901 is inserted between the stair-step flexible circuit connector 4801 and the stair-step printed circuit board 4706. The interposer 4901 shown has a stair-step configuration and could be composed of a z-axis conductive film, a z-axis conductive adhesive film, a PariPoser contactor from Paricon Technologies Corporation or arrays of any type of individual conductive members. The interposer 4901 could also be a dielectric film that prevents current flow between the electrical connector and the printed circuit board, but does allow signals to be received through capacitive coupling.

Relative to FIG. 47 through FIG. 49, another embodiment of the invention is to etch the electrical connector contacts from the metal foil in the flexible circuit into any spring-like member such as a cantilever beam or leaf spring or the like. Each of these spring members can be mechanically shaped or curved so that mating the electrical connector to the printed circuit board's electrical contact pads will provide contact force. Another embodiment of the invention is to shape the ends of the flexible circuit's signal traces, which are electrical contacts, into separate projections that have the appearance of teeth in a comb. This permits each of the contacts to move independently of the other signal traces. The contact in this embodiment can provide contact force or there can be an additional spring member inducing force upon each contact to provide contact force during mating. The movement of any contact does not hinder the contact force associated with adjacent contacts and, thus, a separate part such as an interposer is not necessarily required.

Although the invention has been described with reference to specific exemplary embodiments of the invention thereof, it will be evident that various modifications and changes may be made thereto without departing from the broader spirit and scope of the invention. The specification and drawings are, accordingly, to be regarded in an illustrative rather than a restrictive sense.

What is claimed is:

1. An electrical connector comprising:
one or more dielectric and conductive elements having a plurality of electrical contacts arranged in first and second stair-step configurations on different sides of the electrical connector; and
wherein in the stair-step configurations, the plurality of electrical contacts are disposed to mate with corresponding electrical contacts of one or more electrical components, wherein respective ones of the plurality of electrical contacts on the different sides of the electrical connector are electrically connected to one another via a cantilevered-beam signal conductor passing through a body of the electrical connector.

2. An electrical connector assembly comprising:
a first insulating member having first and second surfaces;
a first plurality of cantilever beam conductors secured adjacent the first surface of the first insulating member; and
a second plurality of cantilever beam conductors secured adjacent the second surface of the first insulating member, wherein a cantilever beam conductor has a first end, a second end, and a mid-section between the first and second ends, wherein the first surface of the first insulating member has a first plurality of slots; and, each of the first plurality of cantilever beam conductors are disposed, at least in part, within a corresponding slot from among the first plurality of slots.

3. The electrical connector assembly of claim 2 wherein: the second surface of the first insulating member has a second plurality of slots; and, each of the second plurality of cantilever beam conductors are disposed, at least in part, within a corresponding slot from among the second plurality of slots.

4. The electrical connector assembly of claim 3 wherein the second plurality of cantilever beam conductors are in electrical continuity with each other.

5. The electrical connector assembly of claim 4 wherein the mid section of the second plurality of cantilever beam conductors are coupled with a conductive ground plate.

6. The electrical connector assembly of claim 5 wherein the second plurality of cantilever beam conductors and the ground plate are integrally formed from a single conductive member.

7. The electrical connector assembly of claim 6 wherein the second plurality of cantilever beam conductors are tapered such that a cross section of a cantilever beam conductor is wider proximate the ground plate and narrower proximate its respective first and second ends, thereby maintaining a cross sectional beam area more closely proportional to a sheer force exerted at any point along a cantilever beam.

8. The electrical connector assembly of claim 4 wherein a border of the first insulating member extends proximate the first and second ends of the second plurality of cantilever beam conductors.

9. The electrical connector assembly of claim 4 wherein the first insulating member comprises a conductive layer electrically isolated from the first plurality of cantilever beam conductors and in electrical continuity with the second plurality of cantilever beam conductors.

10. The electrical connector assembly of claim 9 wherein the first plurality of cantilever beam conductors are arranged in a linear arrangement, and wherein the first ends of the respective first and second plurality of cantilever beam conductors comprise conductive components of corresponding first and second steps of a first stair step electrical interconnect structure on a side of the electrical connector assembly.

11. The electrical connector assembly of claim 10 wherein the first plurality of cantilever beam conductors are segregated into a first plurality of differential pairs, each differential pair having first and second cantilever beam conductors.

12. The electrical connector assembly of claim 11 wherein a space between adjacent cantilever beams of a differential pair of cantilever beams is less than a space between adjacent cantilever beams of separate differential pairs.

13. The electrical connector assembly of claim 11 further comprising a third plurality of cantilever beam conductors, the first ends of the third plurality of cantilever beam conductors arranged in a linear arrangement comprising conductive components of a third stair step of the first stair step electrical interconnect structure.

14. The electrical connector assembly of claim 13 further comprising:
a second insulating member having first and second surfaces;
a third plurality of slots formed in the first surface of the second insulating member, wherein the third plurality of cantilever beam conductors are disposed, at least in part, in corresponding slots from among the third plurality of slots.

15. The electrical connector assembly of claim 14 wherein the second insulating member further comprises a conductive ground layer in electrical continuity with the second plurality of cantilever beam conductors.

16. The electrical connector assembly of claim 14 wherein the third plurality of cantilever beam conductors are in electrical continuity with each other, and with the conductive ground layer of the second insulating member.

17. The electrical connector assembly of claim 16, wherein:
the second surface of the second insulating member comprises a fourth plurality of slots;
the second surface of the second insulating member faces the first surface of the first insulating member; and
first plurality of cantilever beam conductors are disposed, at least in part, in corresponding slots of the fourth plurality of slots.

18. The electrical connector assembly of claim 14 wherein the second surface of the second insulating member faces the second surface of the first insulating member,

* * * * *